(12) United States Patent
Khosravani

(10) Patent No.: US 10,816,583 B2
(45) Date of Patent: Oct. 27, 2020

(54) DIFFERENTIAL CAPACITIVE PROBE FOR MEASURING CONTACT RESISTANCE

(71) Applicant: The Boeing Company, Chicago, IL (US)

(72) Inventor: Shahriar Khosravani, Everett, WA (US)

(73) Assignee: The Boeing Company, Chicago, IL (US)

(*) Notice: Subject to any disclaimer, the term of this patent is extended or adjusted under 35 U.S.C. 154(b) by 147 days.

(21) Appl. No.: 16/202,445

(22) Filed: Nov. 28, 2018

(65) Prior Publication Data
US 2020/0166554 A1 May 28, 2020

(51) Int. Cl.
*G01R 27/26* (2006.01)

(52) U.S. Cl.
CPC ................. *G01R 27/2617* (2013.01)

(58) Field of Classification Search
CPC .................................................. G01R 27/2619
See application file for complete search history.

(56) References Cited

U.S. PATENT DOCUMENTS

| | | | |
|---|---|---|---|
| 6,204,656 B1* | 3/2001 | Cheiky-Zelina ... | G01N 33/2858 324/71.4 |
| 2003/0218168 A1 | 11/2003 | Okajima | |
| 2005/0077907 A1* | 4/2005 | Parker ................ | G01R 31/2853 324/538 |
| 2005/0242824 A1* | 11/2005 | Parker ................ | G01R 31/52 324/538 |
| 2007/0085625 A1* | 4/2007 | Cordes ............... | H01L 25/105 333/24 C |
| 2018/0170576 A1 | 6/2018 | Khosravani | |
| 2018/0266463 A1* | 9/2018 | Mori .................. | B29C 65/48 |
| 2018/0266974 A1 | 9/2018 | Khosravani | |

OTHER PUBLICATIONS

Min Liu: "A New Method for Measuring Contact Resistance", Proceedings, Aug. 17, 2002.
Power on Megger: "A guide to low resistance testing", Dec. 31, 2017, pp. 8, 12-13; figures 17,21.
European Search Report dated Mar. 27, 2020; European Application No. 19212015.

* cited by examiner

*Primary Examiner* — Dominic E Hawkins
(74) *Attorney, Agent, or Firm* — Perman & Green LLP

(57) ABSTRACT

A differential capacitive probe for measuring contact resistance, the differential capacitive probe including a frame, an end effector extending from the frame, a first capacitive pad coupled to the frame so as to at least partially circumscribe the end effector, and a second capacitive pad coupled to the frame so as to be radially spaced, relative to the end effector, from the first capacitive pad and to at least partially circumscribe the end effector, wherein a contact surface area of the first capacitive pad is substantially the same as another contact surface of the second capacitive pad.

20 Claims, 15 Drawing Sheets

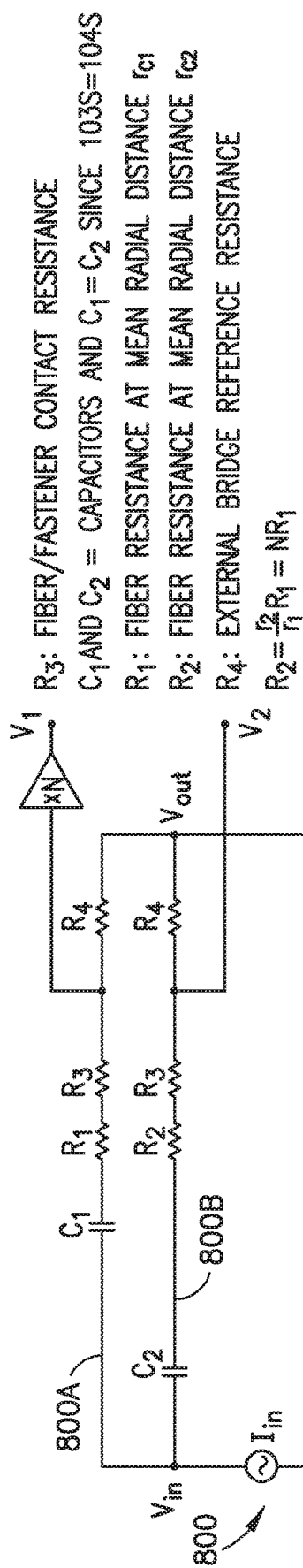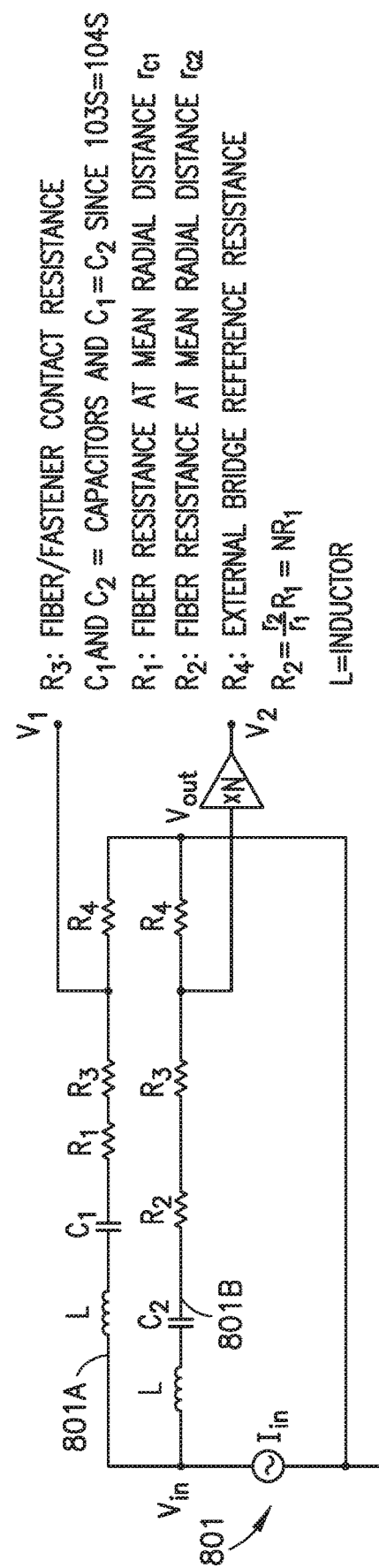
FIG.9A
FIG.9B

DIFFERENTIAL CAPACITIVE PROBE FOR MEASURING CONTACT RESISTANCE

BACKGROUND

1. Field

The exemplary embodiments generally relate to capacitive probes and in particular to differential capacitive probes for measuring contact resistance.

2. Brief Description of Related Developments

Aircraft are frequently struck by lightning. Typically, the lightning initially strikes an extremity of the aircraft, such as the nose or a wing tip and current from the lightning is dispersed through the outer skin and other structures of the aircraft before exiting another extremity, such as the tail. While some aircraft are built with conductive aluminum skins, newer aircraft may have skins made from less conductive composite materials. Composite materials generally include two or more constituent materials, including a matrix material and a reinforcement material. Composite materials used for aircraft skins include carbon fiber reinforced polymers ("CFRPs") wherein a polymer resin serves as the matrix and is reinforced with carbon fibers. Carbon fibers are more conductive than polymer resins and therefore serve as the primary conductor when lightning strikes the aircraft. The carbon fiber skins are produced as panels that are fastened to the each other and/or the frame of the aircraft. It is the carbon fiber skins and fasteners that form a conductive pathway for electrical current to flow as a result of the lightning strike.

To test for continuity and resistance in the conductive pathway direct lighting effect testing may be used. Direct lightning effect testing subjects a system or a component to high current pulses to understand the effect of such high current pulses on materials of the system or the component. For example, an aircraft, such as mentioned above, may be required to pass a direct lightning effect test standard before the aircraft is certified for operation by a government entity, such as the United States Federal Aviation Administration. Other system may also be subjected to direct lightning effect testing, such as wind turbines, architectural structures, etc.

Performing direct lightning effect tests can be resource intensive. For example, large banks of capacitors and complex switching and control systems are generally used to generate short duration, high current pulses. Also, direct lightning effect tests are destructive tests in that parts subjected to direct lightning effects testing are not generally immediately reusable. For example, the part under test may be damaged in a manner that requires inspection and/or repair before reuse.

SUMMARY

Accordingly, apparatuses and methods, intended to address at least the above-identified concerns, would find utility.

The following is a non-exhaustive list of examples, which may or may not be claimed, of the subject matter according to the present disclosure.

One example of the subject matter according to the present disclosure relates to a differential capacitive probe for measuring contact resistance, the differential capacitive probe including a frame, an end effector extending from the frame, a first capacitive pad coupled to the frame so as to at least partially circumscribe the end effector, and a second capacitive pad coupled to the frame so as to be radially spaced, relative to the end effector, from the first capacitive pad and to at least partially circumscribe the end effector, wherein a contact surface area of the first capacitive pad is substantially the same as another contact surface of the second capacitive pad.

Another example of the subject matter according to the present disclosure relates to a differential capacitive probe for measuring contact resistance, the differential capacitive probe including a frame, an end effector extending from the frame, an alternating current source coupled to the end effector, a first capacitive pad coupled to the frame so as to at least partially circumscribe the end effector, and a second capacitive pad coupled to the frame so as to be radially spaced, relative to the end effector, from the first capacitive pad and to at least partially circumscribe the end effector, wherein a contact surface area of the first capacitive pad is substantially the same as another contact surface of the second capacitive pad, wherein electrical current flows from the end effector to each of the first capacitive pad and the second capacitive pad through at least a fiber reinforced material coupling the end effector to each of the first capacitive pad and the second capacitive pad.

Still another example of the subject matter according to the present disclosure relates to a method for measuring a contact resistance with a fiber reinforced material, the method including generating an electrical current flow through the fiber reinforced material between an end effector of a differential capacitive probe and each of a first capacitive pad and a second capacitive pad of the differential capacitive probe, where the second capacitive pad is radially spaced, relative to the end effector, from the first capacitive pad so that the first capacitive pad and the second capacitive pad each at least partially circumscribe the end effector and a contact surface area of the first capacitive pad is substantially the same as another contact surface of the second capacitive pad, receiving, with a controller coupled to the first capacitive pad and the second capacitive pad, respective voltage readings from the first capacitive pad and the second capacitive pad, and determining, with the controller, a contact resistance with the fiber reinforced material where the determination substantially eliminates a fiber resistance of the fiber reinforced material from the determined contact resistance.

BRIEF DESCRIPTION OF THE DRAWINGS

Figure 1:
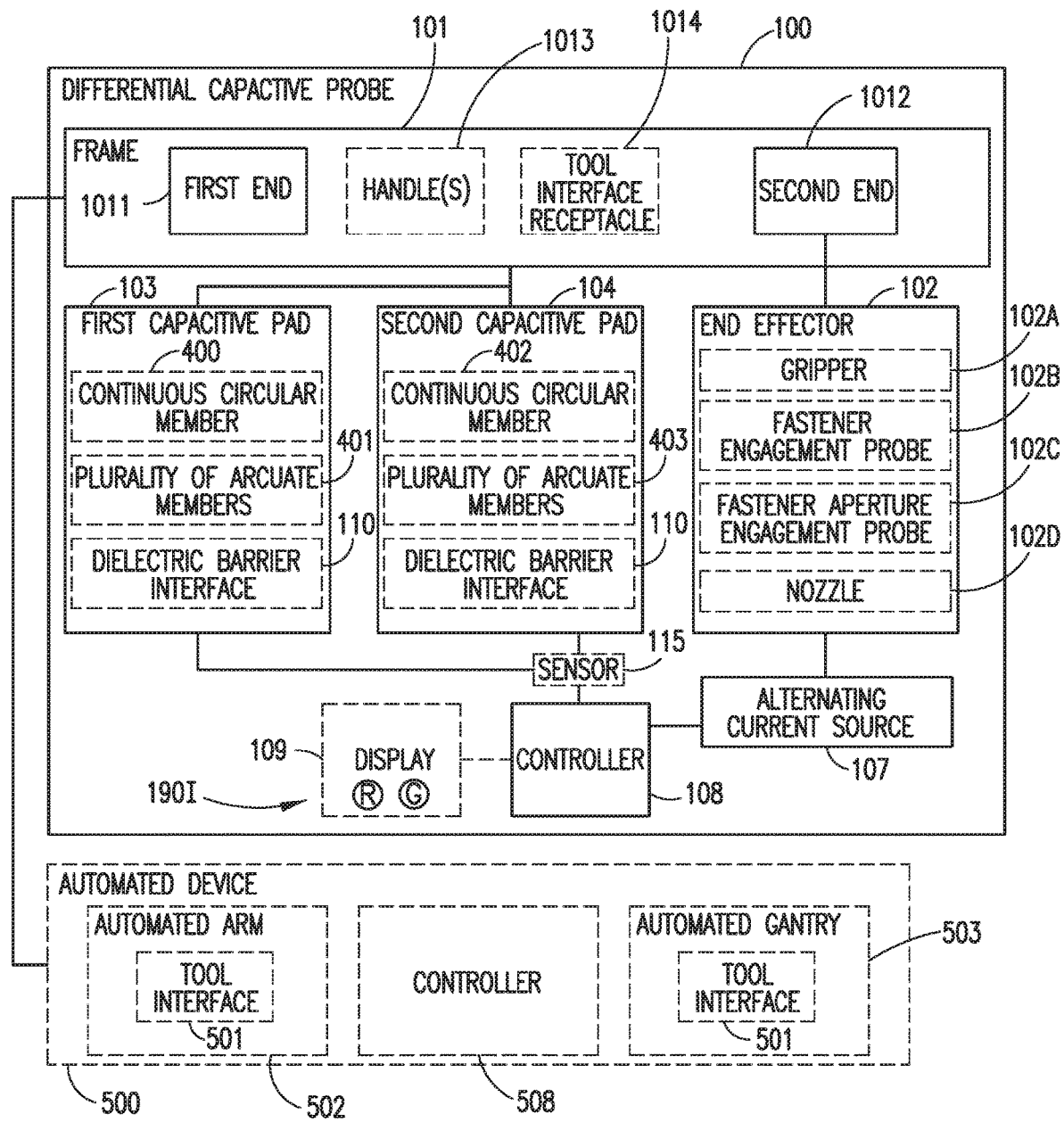
Figure 2:
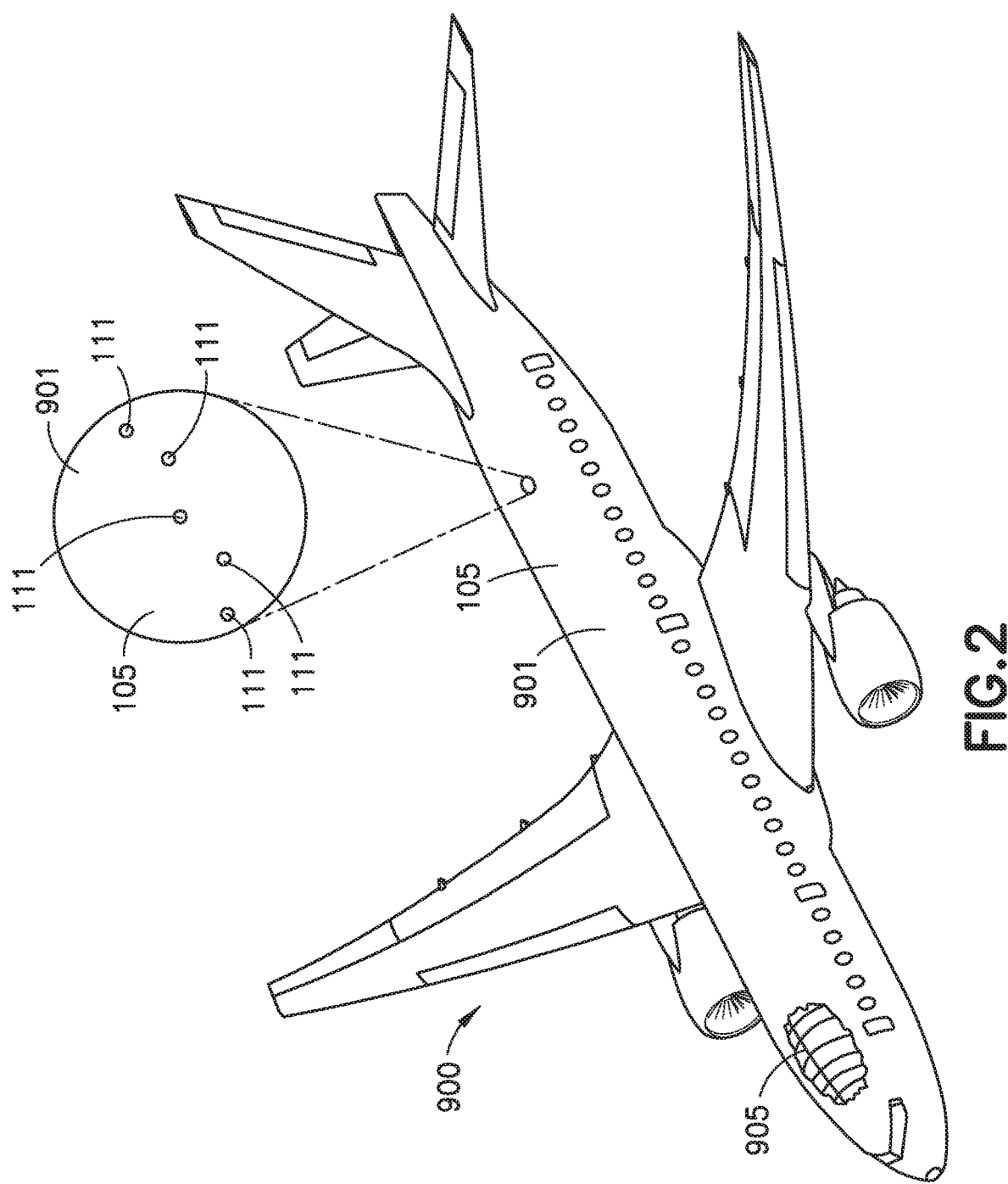
Figure 3:
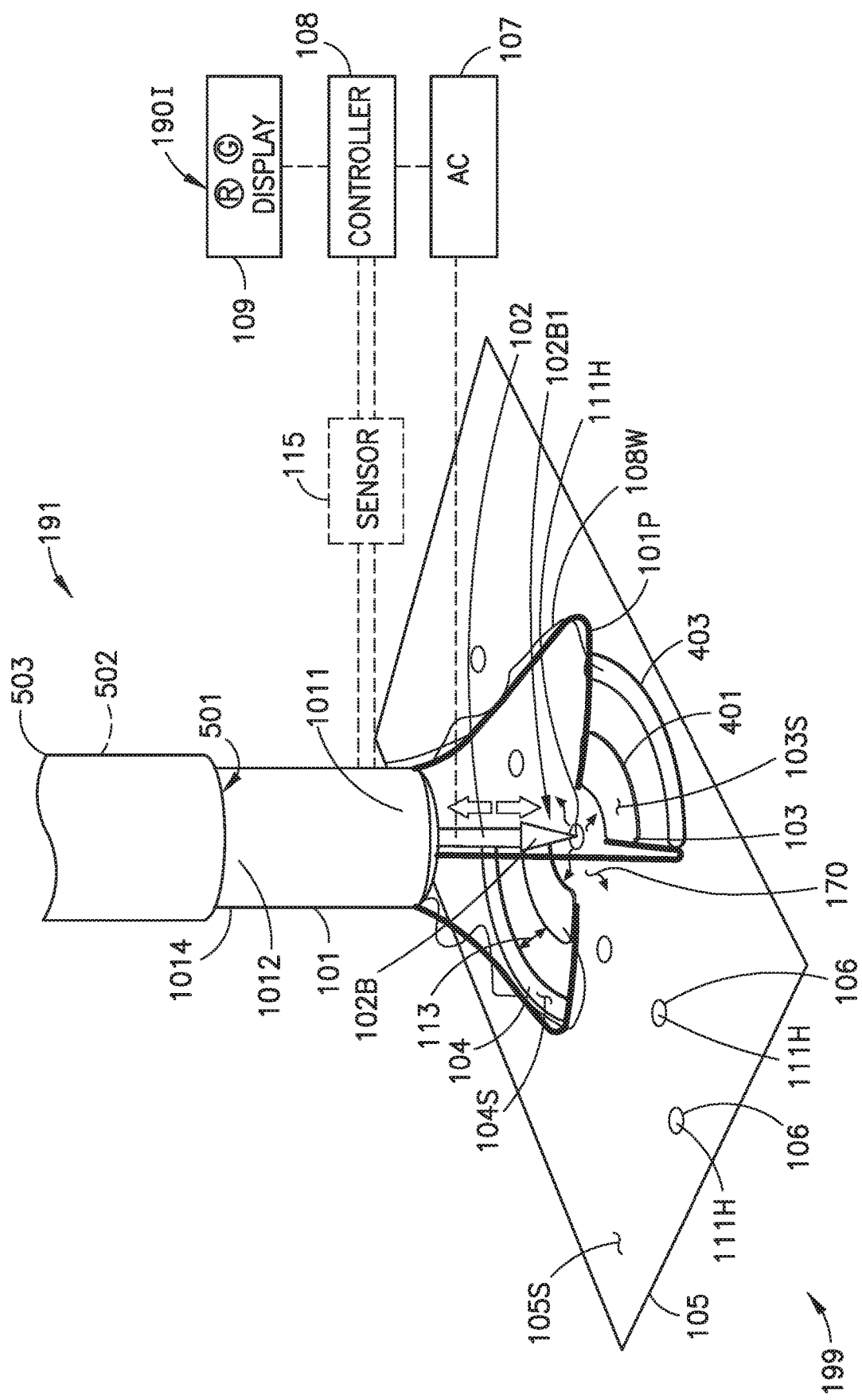
Figure 3A:
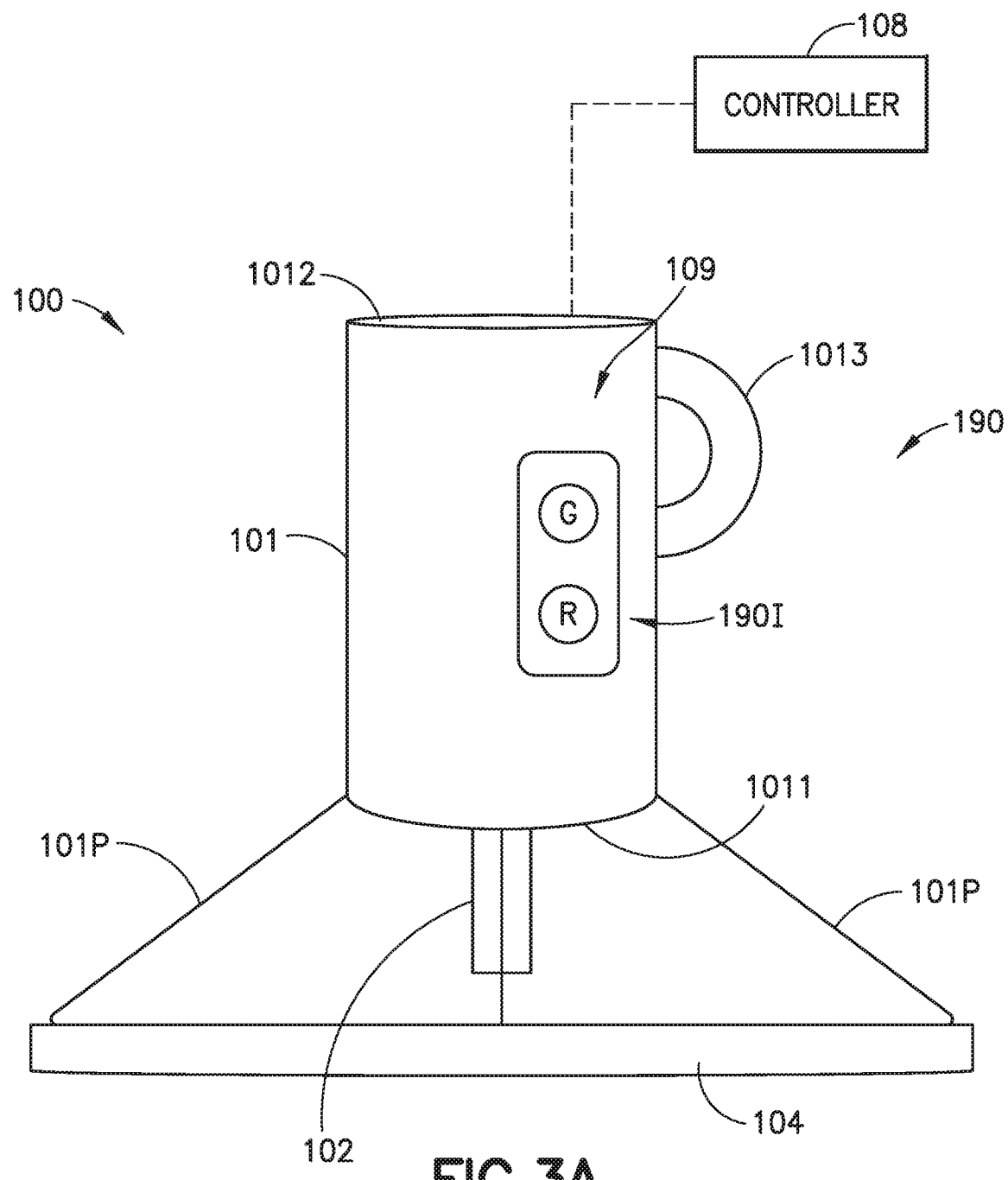
Figure 4:
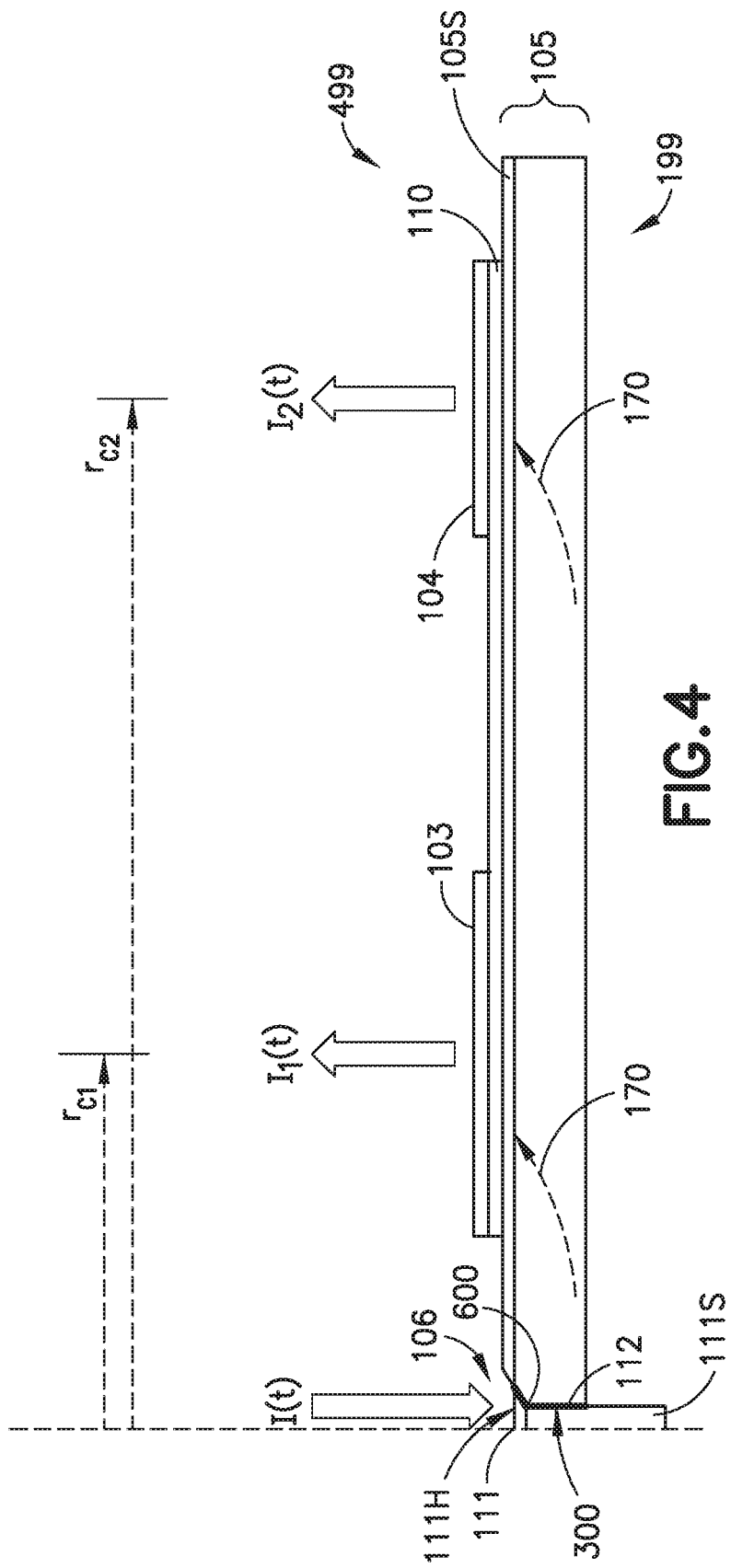
Figure 5:
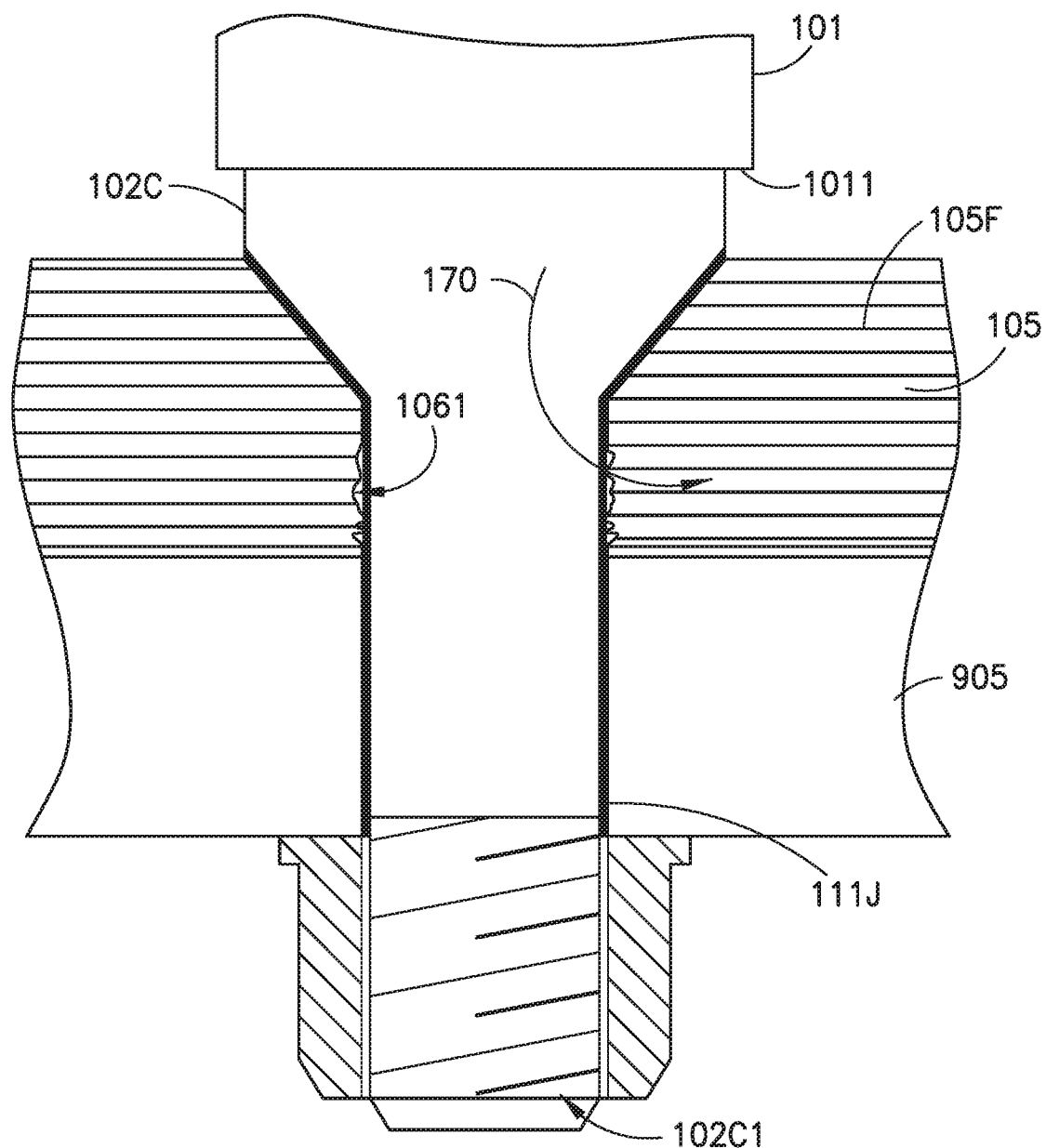
Figure 5A:
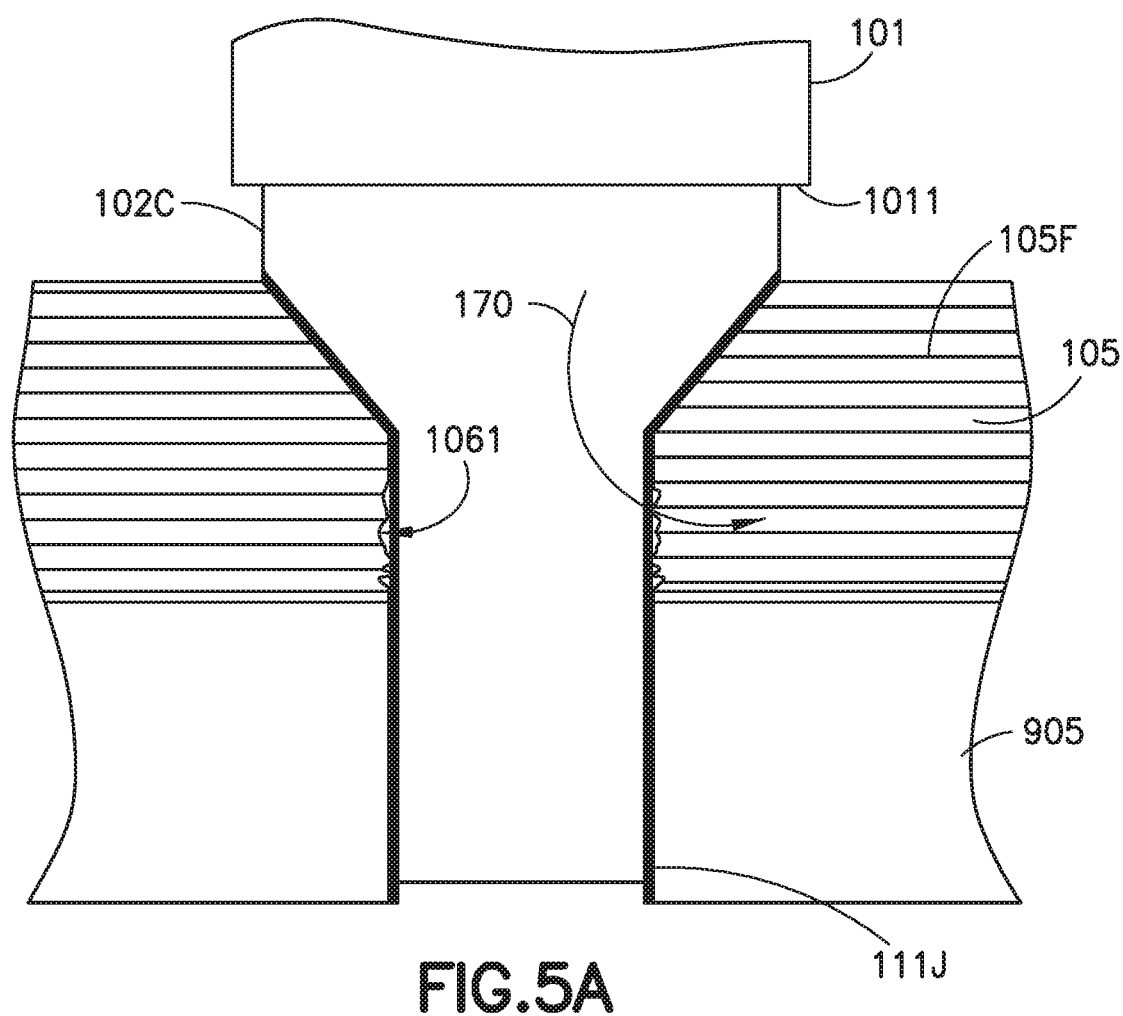
Figure 6:
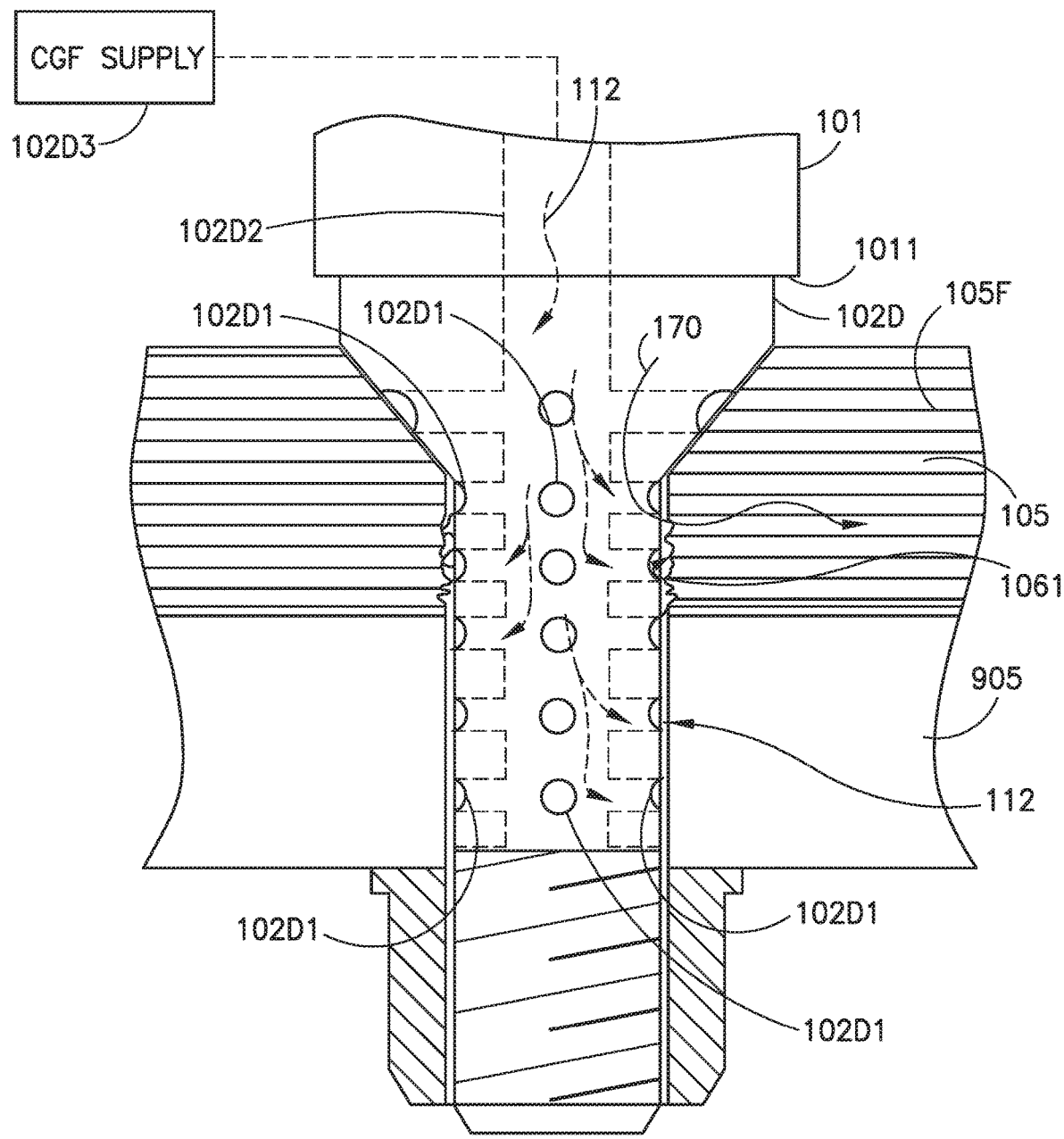
Figure 6A:
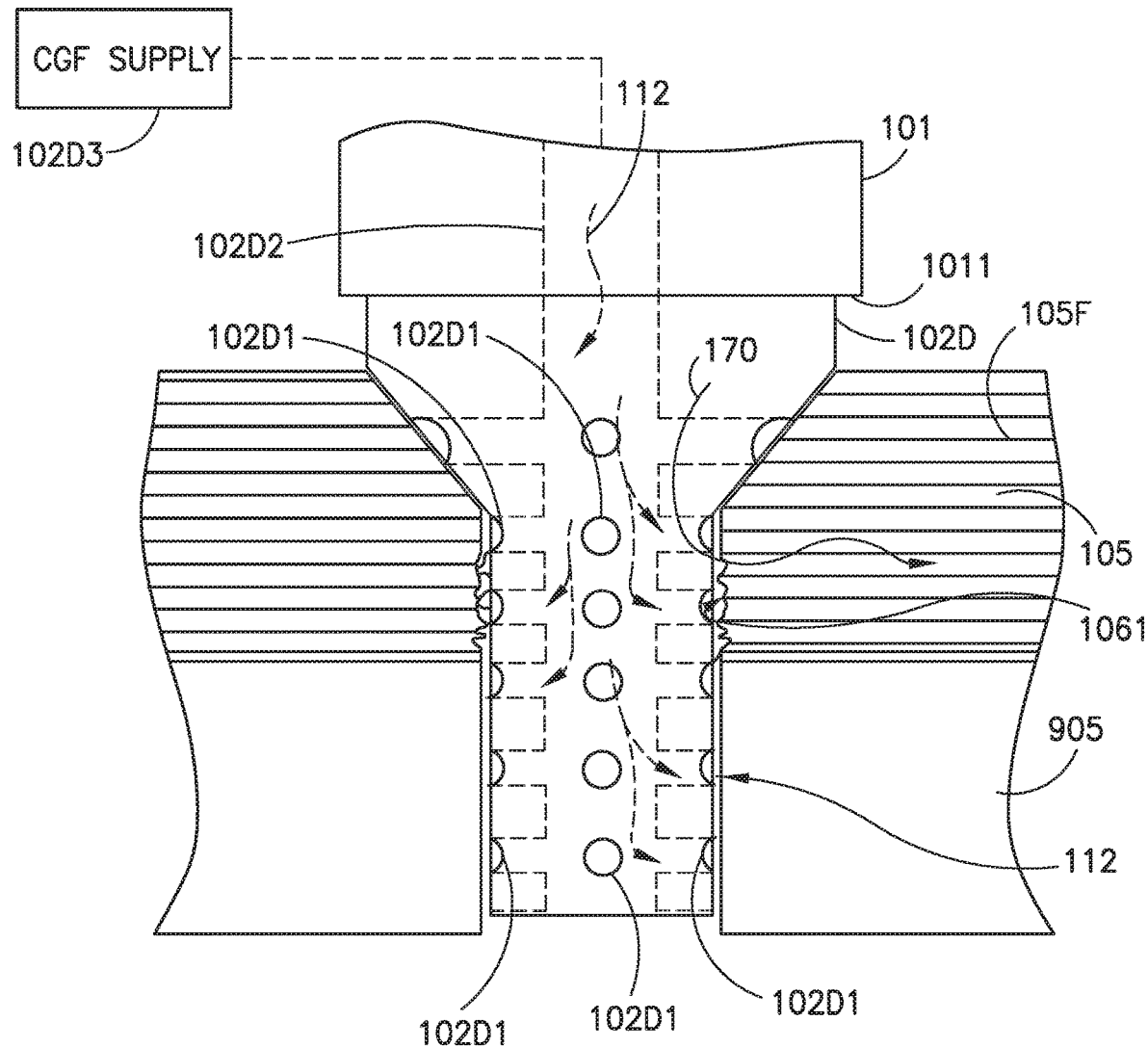
Figure 7:
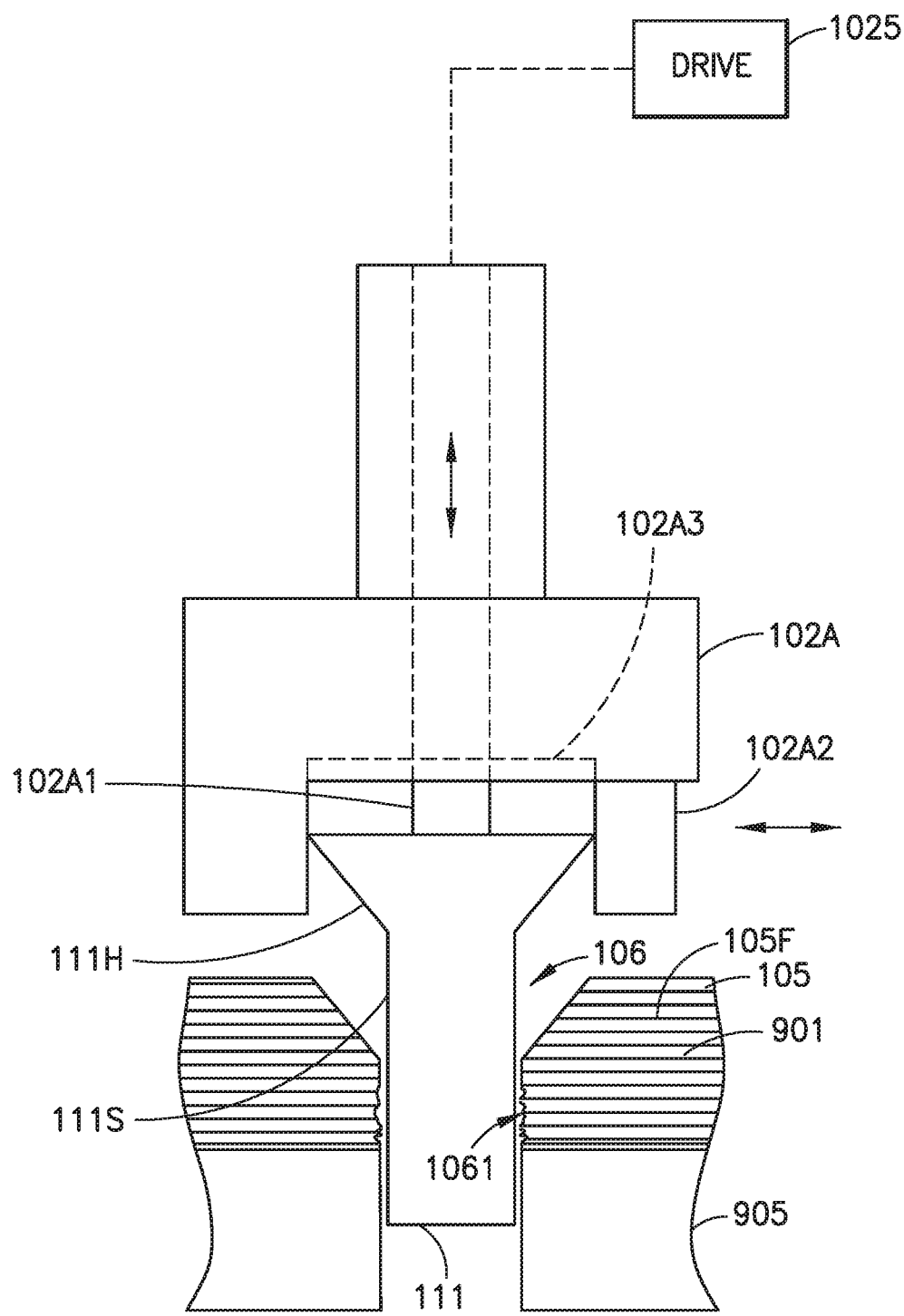
Figure 8A:
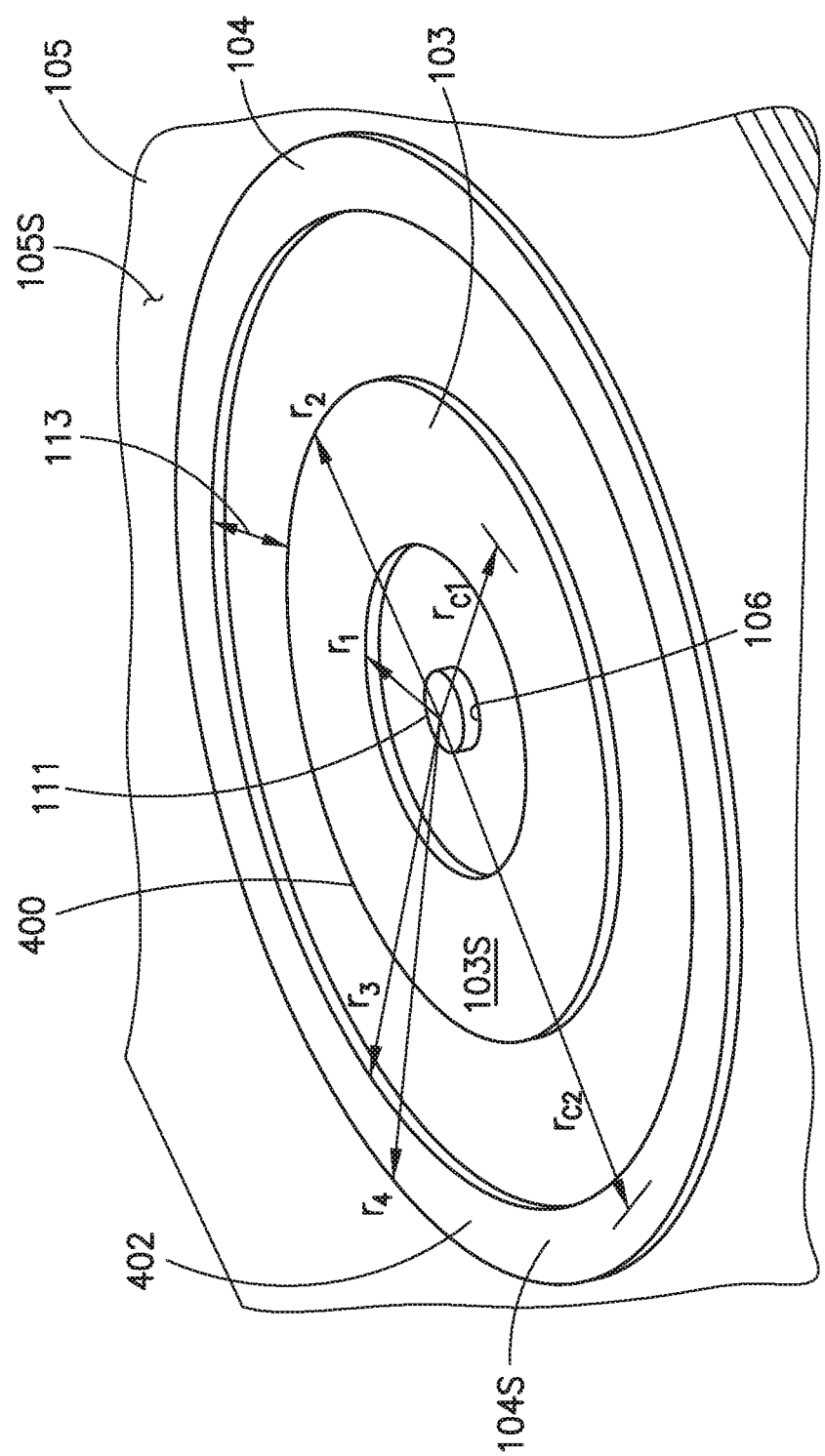
Figure 8B:
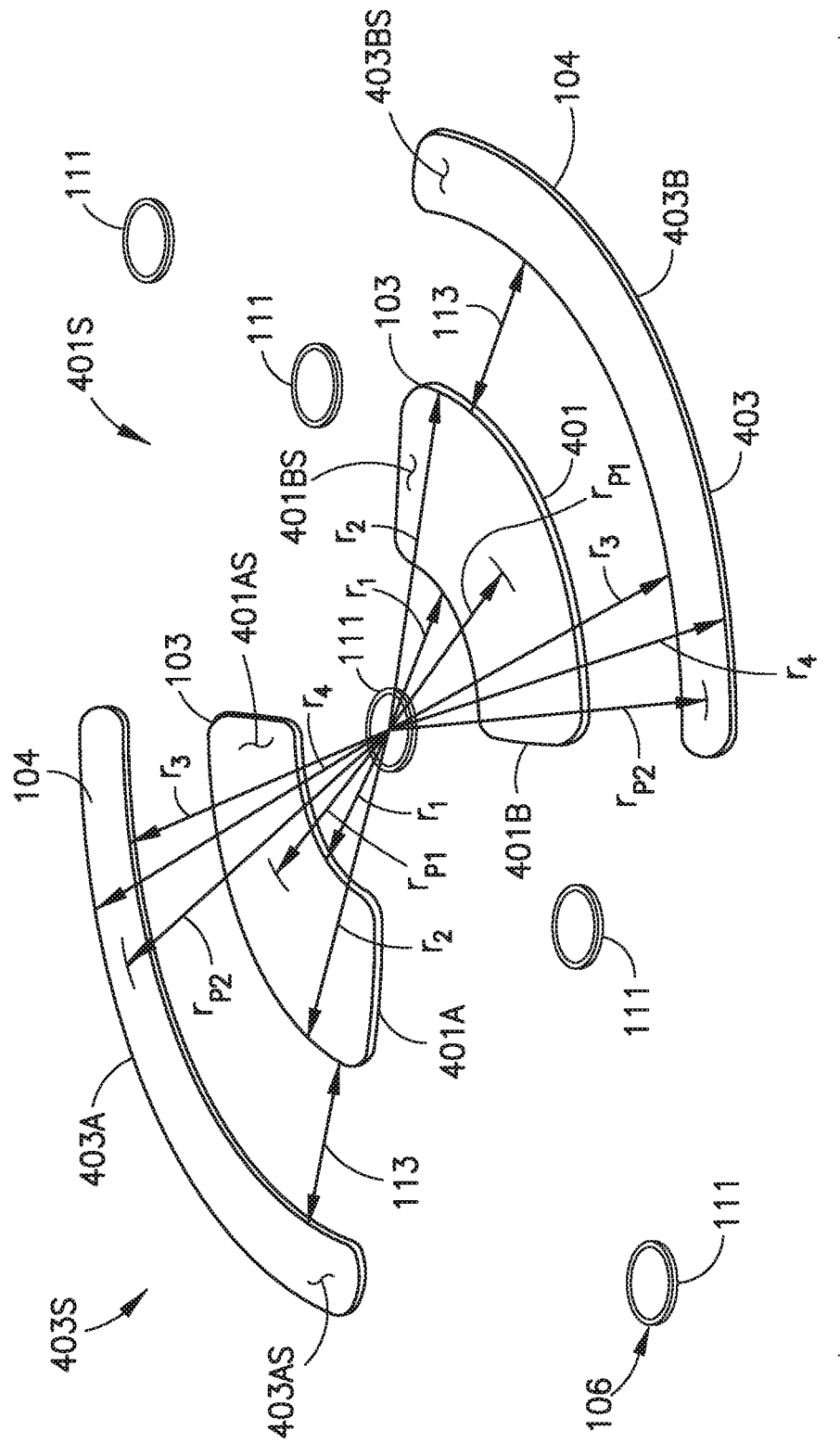
Figure 10:
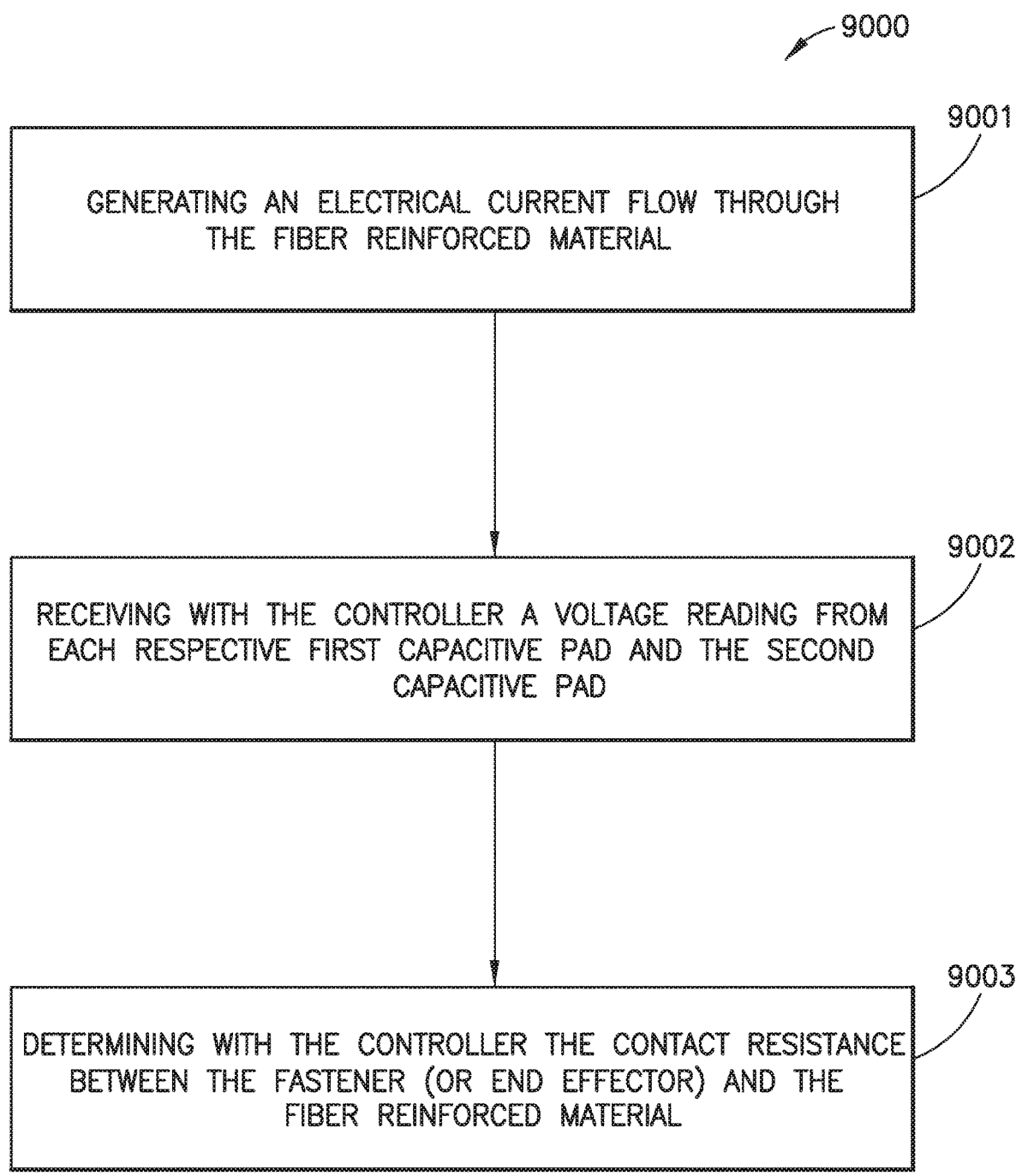
Figure 11:
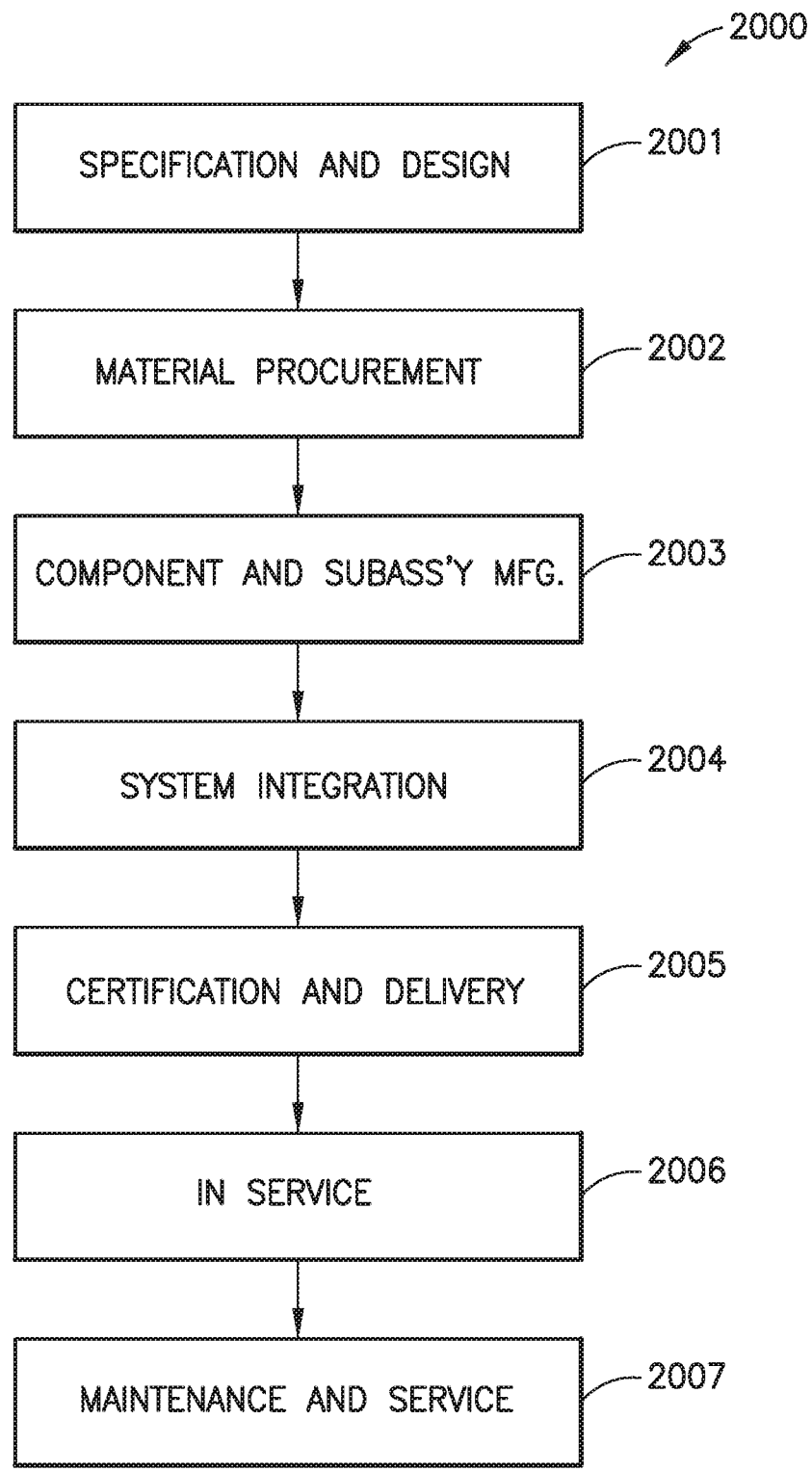

Having thus described examples of the present disclosure in general terms, reference will now be made to the accompanying drawings, which are not necessarily drawn to scale, and wherein like reference characters designate the same or similar parts throughout the several views, and wherein:

FIG. 1 is a block diagram of a differential capacitive probe in accordance with one or more aspects of the present disclosure;

FIG. 2 is a schematic perspective view illustration of an aircraft in accordance with one or more aspects of the present disclosure;

FIG. 3 is a schematic perspective view illustration of the differential capacitive probe of FIG. 1 in accordance with one or more aspects of the present disclosure;

FIG. 3A is a schematic perspective view illustration of the differential capacitive probe of FIG. 1 in accordance with one or more aspects of the present disclosure;

FIG. 4 is a schematic cross-sectional side view illustration of a portion of the differential capacitive probe of FIG. 1 in accordance with one or more aspects of the present disclosure;

FIG. 5 is a schematic side view illustration of a portion of the differential capacitive probe of FIG. 1 in accordance with one or more aspects of the present disclosure;

FIG. 5A is a schematic side view illustration of a portion of the differential capacitive probe of FIG. 1 in accordance with one or more aspects of the present disclosure;

FIG. 6 is a schematic side view illustration of a portion of the differential capacitive probe of FIG. 1 in accordance with one or more aspects of the present disclosure;

FIG. 6A is a schematic side view illustration of a portion of the differential capacitive probe of FIG. 1 in accordance with one or more aspects of the present disclosure;

FIG. 7 is a schematic side view illustration of a portion of the differential capacitive probe of FIG. 1 in accordance with one or more aspects of the present disclosure;

FIG. 8A is a schematic perspective view illustration of a portion of the differential capacitive probe of FIG. 1 in accordance with one or more aspects of the present disclosure;

FIG. 8B is a schematic perspective view illustration of a portion of the differential capacitive probe of FIG. 1 in accordance with one or more aspects of the present disclosure;

FIG. 9A is a circuit diagram illustrating a circuit formed by the differential capacitive probe of FIG. 1 in accordance with one or more aspects of the present disclosure;

FIG. 9B is a circuit diagram illustrating a circuit formed by the differential capacitive probe of FIG. 1 in accordance with one or more aspects of the present disclosure;

FIG. 10 is a block diagram of a method for measuring contact resistance with the differential capacitive probe of FIG. 1 in accordance with one or more aspects of the present disclosure; and FIG. 11 is a block diagram of aircraft production and service methodology in accordance with one or more aspects of the present disclosure.

DETAILED DESCRIPTION

Referring to FIGS. 1-4, the aspects of the present disclosure described herein provide a differential capacitive probe 100 for measuring contact resistance $R_3$ (FIGS. 9A-9B) for a fastener interface of a unit under test 199 (FIG. 3), such as the fastener interface 300 (FIG. 4) between fastener 111 and an outer skin 901 of an aircraft 900. Generally, the outer skin 901 of an aircraft 900 includes panels composed of a fiber reinforced material 105 (also referred to as a composite material) which are fastened to a frame 905 of the aircraft 900 with, e.g., a blind fastening system (including the fastener 111). In one aspect, the fiber reinforced material 105 is a carbon fiber reinforced polymer; however in other aspects the fiber reinforced material 105 may be any suitable material having fiber reinforcement. In order to increase dispersion of current from lightning strikes, the contact resistance $R_3$ between the shank 111S (FIG. 4) of the fastener 111 and the fibers 105F (FIG. 5) of the fiber reinforced material 105 is to be within a predetermined limit, such as that set by the United States Federal Aviation Administration. Direct measurement of the contact resistance $R_3$ at the fastener interface 300 (FIG. 4) with, e.g., an ohm meter is difficult due to limited or no access to a second contact point to connect the measuring probe of the ohm meter (i.e., the blind fastening system may obscure a second contact point) and further due to the anisotropic properties of the fiber reinforced material 105. Additionally, resistance from the fibers 105F (FIG. 5) of the fiber reinforced material 105 is such that direct measurements result in an overall effective resistance $R_{eff}$ that includes the resistance from the fibers 105F.

In accordance with aspects of the present disclosure, the differential capacitive probe 100 is configured to measure the contact resistance $R_3$ (FIGS. 9A-9B) in several ways. For example, the differential capacitive probe 100 may measure the contact resistance $R_3$ through the fastener 111 such that electrical current is passed through the fastener 111 into the fiber reinforced material 105; or the differential capacitive probe 100 may measure the contact resistance $R_3$ by passing the electrical current from an end effector 102 of the differential capacitive probe 100 (where the end effector 102 is shaped and sized to mimic the fastener 111) substantially directly into the fiber reinforced material 105.

In accordance with the aspects of the present disclosure, the differential capacitive probe 100 isolates the contact resistance $R_3$ (FIGS. 9A-9B) of the fastener interface 300 (FIG. 4) of the unit under test 199 (FIG. 3) such that resistance caused by the fibers 105F (FIG. 5) within the fiber reinforced material 105 is substantially eliminated from the resulting resistance measurement obtained by the differential capacitive probe 100, as will be further described below.

It is noted that although the differential capacitive probe 100 is described herein as measuring contact resistance $R_3$ of the unit under test 199 (FIG. 3), such as the outer skin 901 of the aircraft 900, in other aspects the differential capacitive probe 100 may be used to measure a contact resistance $R_3$ at a fastener interface of any suitable structure in any suitable industry, such as for example, the maritime industry, the automotive industry, the aerospace industry, architectural industry, etc. It is further noted that while the aircraft illustrated in FIG. 2 is depicted as a fixed wing aircraft, in other aspects the aircraft may be a rotary wing aircraft or any other suitable aircraft.

Referring to FIGS. 1 and 3-8B, the differential capacitive probe 100 generally includes a frame 101, the end effector 102, a first capacitive pad 103, and a second capacitive pad 104. The differential capacitive probe 100 is configured such that, when positioned for measuring, the differential capacitive probe 100 is in contact with a surface 105S of the fiber reinforced material 105 and one of a fastener aperture 106 formed in the fiber reinforced material 105 or a fastener 111 disposed in the fastener aperture 106. Where the differential capacitive probe 100 is in contact with the fastener aperture 106, the end effector 102 is inserted into the fastener aperture 106. The fastener aperture 106 may include a conductive gap filler 112 disposed in the fastener aperture 106 or a sleeve/jacket 111J (FIG. 5) into which the shank 111S (FIGS. 4 and 7) of the fastener 111 is inserted. The conductive gap filler 112 and the sleeve/jacket 111J may increase the contact between the fastener 111 and the fiber reinforced material 105 when compared to contact between the fastener 111 and a bare fastener aperture.

The frame 101 of the differential capacitive probe 100 may be formed from any suitable material and includes a first end 1011 and a second end 1012 longitudinally spaced from the first end 1011. The end effector 102 is coupled to and extends from the first end 1011 of the frame 101. The end effector 102 may be any suitable end effector including but not limited to a gripper 102A (FIGS. 1 and 7), a fastener engagement probe 102B (FIGS. 1 and 3), a fastener aperture engagement probe 102C (FIGS. 1 and 5-5A), a nozzle 102D (FIGS. 1 and 6-6A), or a combination thereof. Referring to FIGS. 1 and 7, where the end effector comprises at least the gripper 102A (See FIG. 7), the gripper 102A is configured to grasp/hold the fastener 111 and effect insertion of the fastener 111 into the fastener aperture 106. For example, the gripper 102A includes any suitable fastener engagement 102A1 (e.g., Phillips head, Allen/hex head, socket head) that engages the fastener 111 so as to rotate the fastener for insertion into the fastener aperture 106. The gripper 102A may also include fastener retention (e.g., such as movable jaws 102A2, magnets 102A3, etc.) for holding the fastener 111 on the gripper 102A. In this aspect, at least a portion of the gripper 102A is rotatably coupled to the frame 101 and the differential capacitive probe 100 includes any suitable drive 102S (FIG. 7) disposed, e.g., within the frame 101 so as to at least rotationally drive the fastener engagement 102A1 (e.g., to rotate the fastener 111 for insertion into the fastener aperture 106). In one aspect, the drive 102S is also configured to move, e.g., the movable jaws 102A2 for gripping and releasing the fastener 111. Where the fastener is retained on the gripper 102A with a magnet 102A3, the gripping and release of the fastener 111 is effected passively (e.g., without moving parts/active gripping). With the end effector 102 comprising the gripper 102A, the differential capacitive probe 100 may measure/test the contact resistance $R_3$ (FIGS. 9A-9B) in situ with fastener 111 insertion into the fastener aperture 106.

Referring to FIGS. 1 and 3, where the end effector 102 comprises at least the fastener engagement probe 102B, the end effector 102 is configured to couple with, for example, a head 111H of the fastener 111. As an example, the fastener engagement probe 102B includes any suitable shape, such as a conical shape 102B1, that couples with the head 111H of the fastener 111 regardless of a type of fastener head drive configuration (e.g., Phillips, Allen/hex, socket, etc.). With the end effector 102 comprising the fastener engagement probe 102B, the differential capacitive probe 100 may measure/test the contact resistance $R_3$ (FIGS. 9A-9B) after fastener 111 insertion into the fastener aperture 106.

Referring to FIGS. 1 and 5-5A, where the end effector 102 comprises at least the fastener aperture engagement probe 102C, the end effector 102 is configured to couple with, for example, the fastener aperture 106. As an example, the fastener aperture engagement probe 102C is shaped and sized to mimic the fastener 111. For exemplary purposes only, where the fastener is an M12×25 countersunk head machine screw the fastener aperture engagement probe 102C may have a diameter substantially equal to the major diameter of the M12×25 fastener (e.g., such as where the fastener aperture 106 is un-threaded; where the fastener aperture 106 is threaded, the diameter may be substantially equal to the minor diameter) and a length at least substantially equal to the length of the M12×25 fastener so that the fastener aperture engagement probe 102C may be inserted into the fastener aperture 106 for measuring/testing the contact resistance $R_3$ (FIGS. 9A-9B). In one aspect, at least a portion of the fastener aperture engagement probe 102C may include threads 102C1 corresponding to the M12×25 fastener so that the aperture engagement probe may be threadably inserted into a nut disposed on the frame 905 to which the fiber reinforced material 105 is coupled, while extending through an unthreaded fastener aperture 106 for measuring/testing the contact resistance $R_3$. In one aspect, the fastener aperture engagement probe 102C may be threadably inserted into a threaded fastener aperture of the fiber reinforced material 105. With the end effector 102 comprising the fastener aperture engagement probe 102C, the differential capacitive probe 100 may measure/test the contact resistance $R_3$ of the unit under test 199 (FIG. 3) prior to assembly of the unit under test 199 with other, e.g., aircraft components or otherwise prior to fastener 111 insertion into the fastener aperture 106. As noted herein, with the end effector 102 comprising the fastener aperture engagement probe 102C, the end effector 102 may couple with a wall 106I of the fastener aperture 106 where the wall comprises bare fiber reinforced material 105, or the sleeve/jacket 111J disposed within the fastener aperture 106, or the conductive gap filler 112 (FIGS. 4 and 6) disposed within the fastener aperture 106 to measure contact resistance $R_3$.

Referring to FIGS. 1 and 6-6A, where the end effector 102 comprises at least the nozzle 102D the end effector 102 is configured to couple with, for example, the fastener aperture 106 in a manner substantially similar to that described above with respect to the fastener aperture engagement probe 102C. The nozzle 102D may be shaped and sized to mimic the fastener 111 as described above, however in this aspect, the nozzle 102D includes fluid flow paths 102D1 for injecting the conductive gap filler 112 (see also FIGS. 4 and 6) into the fastener aperture 106. The fluid flow paths 102D1 may be arranged radially around the nozzle 102D so as to inject the conductive gap filler 112 radially outward between the nozzle 102D and the wall 106I of the fastener aperture 106. The nozzle 102D may also include a fluid conduit 102D2 extending between the frame 101 of the differential capacitive probe 100 and the nozzle 102D so as to connect the fluid flow paths 102D1 with a conductive gap filler supply 102D3 configured to feed conductive gap filler 112 to the fluid flow paths 102D1. The conductive gap filler 112 may be in the form of a low melting point alloy 600 or any other suitable conductive gap filler. With the end effector 102 comprising the nozzle 102D, the differential capacitive probe 100 may measure/test the contact resistance $R_3$ (FIGS. 9A-9B) in-situ with conductive gap filler 112 insertion into the fastener aperture 106. It is noted that the end effector 102 may be any combination of the above described gripper 102A, fastener engagement probe 102B, fastener aperture engagement probe 102C, or nozzle 102D such that the end effector 102 may dispense conductive gap filler 112, test contact resistance $R_3$ (FIGS. 9A-9B) between the conductive gap filler 112 and the fiber reinforced material 105, and insert the fastener 111.

Referring to FIGS. 1 and 3, the end effector 102 includes an alternating current source 107 coupled to the end effector 102, the alternating current source 107 being configured to generate an electrical current flow 170. The alternating current source 107 is coupled to the end effector 102 so as to transfer the electrical current flow 170 through the end effector 102 into the fiber reinforced material 105. Where the end effector 102 comprises at least the fastener engagement probe 102B, the fastener engagement probe 102B is configured to couple to the fastener 111. The fastener engagement probe 102B, coupled to the fastener 111, conducts the electrical current flow 170 generated from the alternating current source 107 through the fastener 111 and into the fiber reinforced material 105, where the electrical current flow 170 is dispersed through the fibers 105F. Where the end effector 102 comprises at least the fastener aperture engagement probe 102C (FIGS. 5 and 5A) and/or the nozzle 102D (FIGS. 6 and 6A), the fastener aperture engagement probe 102C and/or the nozzle 102D is configured to couple to one of the wall 106I, the sleeve/jacket 111J, or the conductive gap filler 112 disposed within the fastener aperture 106. The fastener aperture engagement probe 102C and/or the nozzle 102D conducts the electrical current flow 170 generated from the alternating current source 107 through one of the wall 1061, the sleeve/jacket 111J, or the conductive gap filler 112 and into the fiber reinforced material 105 where the electrical current flow 170 is dispersed through the fibers 105F.

Referring to FIGS. 3, 4, 8A, 8B and 9A, the first capacitive pad 103 includes an inner radius $r_1$ (FIG. 8A), an outer radius $r_2$ (FIG. 8A), and a contact surface area 103S. The first capacitive pad 103 is coupled to the frame 101 between the first end 1011 and the second end 1012 in any suitable manner. In other aspects, the first capacitive pad 103 is coupled to or adjacent the first end 1011. In one aspect, the first capacitive pad 103 may be coupled to the frame 101 with prongs 101P (FIG. 3). The prongs 101P may be resilient such that the first capacitive pad 103 conforms to the surface 105S of the fiber reinforced material 105, effected in part by the resilience of the prongs 101P. The first capacitive pad 103 is coupled to the frame 101 so as to at least partially circumscribe the end effector 102. In one aspect, the first capacitive pad 103 circumscribes the end effector 102 entirely, such that the first capacitive pad 103 is a continuous circular member 400 (FIG. 8a) having the surface contact area 103S; while in other aspects the first capacitive pad 103 partially circumscribes the end effector 102, such that the first capacitive pad 103 includes a plurality of arcuate members 401 (FIGS. 3 and 8B). Where the first capacitive pad 103 includes a plurality of arcuate members 401, each arcuate member 401A, 401B has an inner radius $r_1$ and an outer radius $r_2$ which are equal, such that the inner radius $r_1$ of arcuate member 403A is equal to the inner radius $r_1$ of arcuate member 403B and the outer radius $r_2$ of arcuate member 403A is equal to the outer radius $r_2$ of arcuate member 403B. Each arcuate member 401A, 401B has a respective contact surface area 401AS, 401BS, where the sum of the respective contact surface areas 401AS, 401BS is referred to as contact surface area 103S (which may or may not be a same amount of surface area as the continuous circular member 400).

The second capacitive pad 104 is substantially concentric with the first capacitive pad 103 and includes an inner radius $r_3$, an outer radius $r_4$, and a contact surface area 104S and is coupled to the frame 101 so as to be radially spaced, relative to the end effector 102, from the first capacitive pad 103. The second capacitive pad 104 may be coupled to the frame 101 with the prongs 101P in a manner substantially similar to the first capacitive pad 103 (e.g., the prongs 101P are common to both the first capacitive pad 103 and the second capacitive pad 104); while in other aspects, the second capacitive pad 104 may be coupled to the frame independent of the first capacitive pad 103 in any suitable manner. The second capacitive pad 104 is coupled to the frame 101 so as to at least partially circumscribe the end effector 102. In one aspect, the second capacitive pad 104 circumscribes the end effector 102 entirely such that the second capacitive pad 104 is a continuous circular member 402 (FIG. 8A) having the contact surface area 104S; while in other aspects the second capacitive pad 104 at least partially circumscribes the end effector 102, such that the second capacitive pad 104 includes a plurality of arcuate members 403 (FIGS. 3 and 8B). Where the second capacitive pad 104 includes a plurality of arcuate members 403, each arcuate member 403A, 403B has an inner radius $r_3$ and an outer radius $r_4$ which are equal, such that the inner radius $r_3$ of arcuate member 403A is equal to the inner radius $r_3$ of arcuate member 403B and the outer radius $r_4$ of arcuate member 403A is equal to the outer radius $r_4$ of arcuate member 403B. Each arcuate member 403A, 403B has a surface area 403AS, 403BS, where the sum of the respective contact surface areas 403AS, 403BS is referred to as contact surface area 104S (which may or may not be a same amount of surface area as the continuous circular member 402).

The first capacitive pad 103 and the second capacitive pad 104 are radially spaced from one another, forming spacing 113, so as to effect an in situ contact resistance measurement that is substantially isolated to contact between the end effector 102 (or fastener 111) and the fiber reinforced material 105 as described further below. Positioned on the surface 105S of the fiber reinforced material 105, the first capacitive pad 103 and the second capacitive pad 104 at least partially circumscribe at least one fastener aperture 106.

The first and second capacitive pads 103, 104 may be formed of any suitable material, such as, e.g., conductive foam, metallic material, or any other suitable material, either pliable or rigid. In one aspect, where the first and second capacitive pads 103, 104 comprise the continuous circular members 400, 402, the contact surface area 103S of the first capacitive pad 103 is substantially the same as the contact surface area 104S of the second capacitive pad 104 such that $(r_2^2-r_1^2)=(r_4^2-r_3^2)$; where $(r_2^2-r_1^2)$ is equal to the mean radial distance $r_{c1}$ and $(r_4^2-r_3^2)$ is equal to mean radial distance $r_{c2}$ (see FIG. 8A). Where the first and second capacitive pads 103, 104 comprise the plurality of arcuate members 401, 403, the contact surface area 103S (e.g., the sum of the respective contact surface areas 401AS, 401BS) of the first capacitive pad 103 is substantially the same as the contact surface area 104S (e.g., the sum of the respective contact surface areas 403AS, 403BS) of the second capacitive pad 104 such that $(r_2^2-r_1^2)=(r_4^2-r_3^2)$; where $(r_2^2-r_1^2)$ is equal to the mean radial distance $r_{p1}$ and $(r_4^2-r_3^2)$ is equal to mean radial distance $r_{p2}$ (see FIG. 8B)

The first capacitive pad 103 and the second capacitive pad 104 are configured to be positioned on the fiber reinforced material 105 so as to conform to the surface 105S of the fiber reinforced material 105 forming an alternating current capacitive coupling 499 (FIG. 4). The first capacitive pad 103 and the second capacitive pad 104 each include a dielectric barrier interface 110; while in other aspect, the dielectric barrier interface 110 may be common to both the first capacitive pad 103 and the second capacitive pad 104 (it is noted that a dielectric barrier with a high relative permittivity $\varepsilon_r$ (i.e., the ability of a substance to store electrical energy in an electric field), can minimize capacitance contribution and surface thickness variation/error of the fiber reinforced material 105, such that the effective capacitance becomes mainly dependent on the dielectric thickness and permittivity $\varepsilon_r$ (i.e., dielectric permittivity $\varepsilon_r$ is substantially higher than the permittivity $\varepsilon_r$ of the fiber reinforced material 105). The dielectric barrier interface 110 is disposed between a respective first and second capacitive pad 103, 104 and the fiber reinforced material 105 so as to couple the respective first and second capacitive pad 103, 104 with the surface 105S (FIG. 4) of the fiber reinforced material 105. The dielectric barrier interface 110 is configured to transmit the current from the fiber reinforced material 105 (i.e., the first plate/terminal of the capacitor) through the dielectric barrier interface 110 (i.e., the dielectric medium of the capacitor) as displacement current and into the first capacitive pad 103 and the second capacitive pad (i.e., the second plate/terminal of the capacitor). For example, the first capacitive pad 103 and the second capacitive pad 104 are each configured to receive electrical current flow 170 (i.e., displacement current) from the end effector 102, where the electrical current flow 170 is generated by the alternating current source 107. The alternating current source 107 may be actuated to flow the electrical current flow 170 through the end effector 102 so that the electrical current flow 170 is dispersed through the fiber reinforced material 105 via the end effector 102 (or fastener 111). The end effector 102 coupled, e.g., directly to the fiber reinforced material 105 or any one of the fastener 111 and the conductive gap filler 112, transmits the electrical current flow 170 into the fiber reinforced material 105. The electrical current flow 170 transmitted into the fiber reinforced material 105 is dispersed through the fiber reinforced material 105 and subsequently flows to the first capacitive pad 103 and the second capacitive pad 104 positioned on the fiber reinforced material 105, where the electrical current flow 170 is transmitted by the dielectric barrier interface 110 into the first capacitive pad 103 and the second capacitive pad 104 as displacement current.

Referring now to FIGS. 1, 8A, and 9A, the end effector 102, the first capacitive pad 103 and the second capacitive pad 104 each coupled to the frame 101 form an electrical circuit 800 (see FIG. 9A) configured to substantially eliminate the fiber resistance of the fiber reinforced material 105 from the overall effective resistance $R_{eff}$ so as to isolate the contact resistance $R_3$ between the fastener 111 (or the end effector 102) and the fiber reinforced material 105. As illustrated in FIG. 9A, the electrical circuit 800 includes a voltage $V_{in}$ and current $I_{in}$ which is the voltage and current generated by the alternating current source 107 and input into the fiber reinforced material 105 by the differential capacitive probe 100. The voltage $V_{in}$ and current $I_{in}$ flow through two branches 800A, 800B. Each of the branches 800A, 800B represent the electrical current flow 170 from the fastener 111 (or end effector 102) to a respective first capacitive pad 103 and second capacitive pad 104. For example, branch 800A corresponds to flow from the fastener 111 (or end effector 102) to the first capacitive pad 103 and branch 800B corresponds to flow from the fastener 111 (or end effector 102) to the second capacitive pad 104. As such, the resistance $R_1$ in branch 800A represents fiber resistance at radial distance rc1 of the first capacitive pad 103 and the resistance $R_2$ represents the fiber resistance at radial distance rc2 (it is noted that since the contact surface area 103S and the contact surface area 104S are equal:

$$R_2=(r_2/r_1)R1=NR_1; \quad [1]$$

where $N=r_2/r_1$ and is an integer value.

Resistance $R_3$ is the contact resistance and resistance $R_4$ is external bridge reference resistance (it is noted that the external bridge reference resistances $R_4$ are merely for branch current division comparison and are not directly compared to resistance of the fiber reinforced material 105. By determining the current division difference using two capacitive probes (i.e., the first and second capacitive pads 103, 104), the controller 108 (as described below) can differentiate the measured resistances in the two branches 800A, 800B and substantially eliminate the fiber resistance portion ($R_1$, $R_2$) in the measurement leaving the contact resistance $R_3$ remaining). $V_1$ and $I_1$ are the voltage and current measured at the first capacitive pad 103 and $V_2$ and $I_2$ are the voltage and current measured at the second capacitive pad. $R_{eff}$ is the overall effective resistance.

Elimination of the fiber resistance and isolation of the contact resistance $R_3$ for the electrical circuit 800 is illustrated by the following proof:

$$V_{in}=I_{in}R_{eff} \quad [2]$$

$$R_{eff}=(R_{eff\_1}*R_{eff\_2})/(R_{eff\_1}+R_{eff\_2}) \quad [3]$$

$$R_{eff\_1}=(j/C_1\omega)+R_1+R_3+R_4 \quad [4]$$

$$R_{eff\_2}=(j/C_1\omega)+R_2+R_3+R_4 \quad [5]$$

where j is a complex number, $\omega$ is frequency, and $(j/C_1\omega)$ is a capacitive reactance.

$$V_1=I_1R_4 \quad [6]$$

$$I_1=V_{in}/R_{eff\_1} \quad [7]$$

Substituting $V_{in}$ in equation [7] with equation [2] results in the following:

$$I_1=I_{in}(R_{eff\_2}/R_{eff\_1}+R_{eff\_2}) \quad [8]$$

Substituting $I_1$ in equation [6] with equation [8] results in the following:

$$V_1=R_4I_{in}(R_{eff\_2}/R_{eff\_1}+R_{eff\_2}) \quad [9]$$

Thus, $V_1=\alpha((j/C_1\omega)+R_1+R_3+R_4)$; where $\alpha=(R_4I_{in}/R_{eff\_1}+R_{eff\_2}) \quad [10]$ $$V_2=I_2R_4 \quad [11]$$

$$I_2=V_{in}/R_{eff\_2} \quad [12]$$

Substituting Vin in equation [12] with equation [2] results in the following:

$$I_2=I_{in}(R_{eff\_1}/R_{eff\_1}+R_{eff\_2}) \quad [13]$$

Substituting $I_2$ in equation [11] with equation [13] results in the following:

$$V_2=R_4I_{in}(R_{eff\_1}/R_{eff\_1}+R_{eff\_2}) \quad [14]$$

Thus, $V_2=\alpha((j/C_1\omega)+R_2+R_3+R_4)$; where $\alpha=(R_4I_{in}/R_{eff\_1}+R_{eff\_2}) \quad [15]$ $$V_{out}=NV_1-V_2 \quad [16]$$

Substituting $V_1$ and $V_2$ in equation [16] with equations [10] and [15], respectively, results in the following:

$$V_{out}=(\alpha N((j/C_1\omega)+R_1+R_3+R_4)-(\alpha((j/C_1\omega)+NR_1+R_3+R_4)=\alpha(N-1)(((j/C_1\omega\_+R4)-R_3) \quad [17]$$

Thus, $V_{out}=\alpha(N-1)(\beta-R_3)$; where $((j/C_1\omega)R4)=\beta \quad [18]$ Solving for $R_3$ in equation [18] results in the following:

$$R_3\beta-(V_{out}/\alpha(N-1)) \quad [19]$$

In another aspect, referring to FIGS. 1, 3, 8B, and 9B, the end effector 102, the first capacitive pad 103 and the second capacitive pad 104 each coupled to the frame 101 form an electrical circuit 801 (see FIG. 9B) configured to substantially eliminate the fiber resistance of the fiber reinforced material 105 from the overall effective resistance $R_{eff}$ so as to isolate the contact resistance $R_3$ between the fastener 111 (or the end effector 102) and the fiber reinforced material 105. It is noted that the electrical components of circuit 801 are substantially the same as the components for circuit 800 described above except an inductor is added to each branch 801A, 801B of the circuit 801 to simplify elimination of the fiber resistance as illustrated by the following proof:

$$V_{in}=I_{in}R_{eff} \quad [20]$$

$$R_{eff}=(R_{eff\_1}*R_{eff\_2})/(R_{eff\_1}+R_{eff\_2}) \quad [21]$$

$$R_{eff\_1}=jL\omega-(j/C_1\omega)+R_1+R_3+R_4 \quad [22]$$

$$R_{eff\_2}=jL\omega-(j/C_1\omega)+R_2+R_3+R_4 \quad [23]$$

where j is a complex number, $\omega$ is frequency, $(j/C_1\omega)$ is a capacitive reactance, and $L\omega=1/C_1\omega$ (resonance @ $\omega$) (noting $jL\omega-(j/C_1\omega)$ is substantially zero);

$$V_1=I_1R_4 \quad [24]$$

$$I_1=V_{in}/R_{eff\_1} \quad [25]$$

Substituting $V_{in}$ in equation [25] with equation [20] results in the following:

$$I_1 = I_{in}(R_{eff\_2}/R_{eff\_1} + R_{eff\_2})  \quad [26]$$

Substituting $I_1$ in equation [24] with equation [26] results in the following:

$$V_1 = R_4 I_{in}(R_{eff\_2}/R_{eff\_1} + R_{eff\_2})  \quad [27]$$

Thus, $V_1 = \alpha(R_2 + R_3 + R_4)$; where $\alpha = (R_4 I_{in}/R_{eff\_1} + R_{eff\_2})$  [28]

$$V_2 = I_2 R_4  \quad [29]$$

$$I_2 = V_{in}/R_{eff\_2}  \quad [30]$$

Substituting $V_{in}$ in equation [30] with equation [20] results in the following:

$$I_2 = I_{in}(R_{eff\_1}/R_{eff\_1} + R_{eff\_2})  \quad [31]$$

Substituting $I_2$ in equation [29] with equation [31] results in the following:

$$V_2 = R_4 I_{in}(R_{eff\_1}/R_{eff\_1} + R_{eff\_2})  \quad [32]$$

Thus, $V_2 = \alpha(R_1 + R_3 + R_4)$; where $\alpha = (R_4 I_{in}/R_{eff\_1} + R_{eff\_2})$  [33]

$$V_{out} = V_1 - NV_2 = \alpha(+R_3 + R_4) - \alpha N(\alpha R_3 + R_4) = \alpha(1-N)(R_3 + R_4)  \quad [34]$$

thus, $V_{out} = \alpha(1-N)(R_3 + R_4)$  [35]

Solving for $R_3$ in equation [35] results in the following:

$$R_3 = (V_{out}/\alpha(a-N)) - R_4  \quad [36]$$

Referring to FIGS. 1 and 3-3A, in one aspect, the differential capacitive probe 100 is a handheld test instrument 190 (FIG. 3A) that includes one or more handle 1013 disposed on the frame 101. The one or more handle 1013 is configured so that an operator may handle and move the differential capacitive probe 100 to/from various test locations. For example, the differential capacitive probe 100 may be moved to each fastener location of a plurality of fastener locations to measure/test the contact resistance $R_3$ (FIG. 9A-9B) of the different fastener locations. The differential capacitive probe 100 configured as the handheld test instrument 190 may facilitate contact resistance $R_3$ measurement/testing after repair of the outer skin 901, such as, after scarfing.

In another aspect, the differential capacitive probe may be configured as an automated test instrument 191 (FIG. 3) and be configured for coupling with an automated device 500. For example, the frame 101 of the differential capacitive probe includes a tool interface receptacle 1014 that is configured to couple with tool interface 501 of an automated device 500 (e.g., of a robotic arm 502 or a robotic gantry 503 (see FIG. 1)) where the automated device 500, under control of automated device controller 508, moves the differential capacitive probe 100 to each fastener location of a plurality of fastener locations to measure/test the contact resistance $R_3$ of the different fastener locations. The differential capacitive probe 100 configured as either the handheld test instrument 190 or the automated test instrument 191 may facilitate contact resistance $R_3$ measurement/testing after repair of the outer skin 901, such as, after scarfing. In other aspects, the differential capacitive probe 100 configured as either the handheld test instrument 190 or the automated test instrument 191 may facilitate contact resistance $R_3$ measurement/testing during production or maintenance of the unit under test 199 (FIG. 3).

In one aspect, the differential capacitive probe 100 further includes a controller 108. In one aspect, the controller 108 may be an onboard controller such that the controller 108 is disposed within the frame 101 of the differential capacitive probe 100. In another aspect, the controller may be remote such as at an operator's station. The controller 108 may include any non-transitory computer-readable media and is coupled to each of the alternating current source 107, the first capacitive pad 103, and the second capacitive pad 104 with, e.g., wires 108W. The controller 108 is configured to actuate the alternating current source 107 and receive current/voltage readings from each of the first capacitive pad 103 and the second capacitive pad 104. In one aspect, the controller 108 may include a current/voltage sensor 115 to detect the current/voltage from the first capacitive pad 103 and the second capacitive pad 104 and generate a signal corresponding to/representing that current/voltage which is received by the controller.

In one aspect, the controller 108 is configured to determine and compare a measured contact resistance $R_3$, between the fastener 111 (or end effector 102) and the fiber reinforced material 105, with a predetermined contact resistance stored within the controller 108. For example, the controller 108 actuates the alternating current source 107 which sends electrical current flow 170 through the end effector 102 and the fastener 111 into the fiber reinforced material 105 which disperses through the fibers 105F of the fiber reinforced material 105. The electrical current flow 170 dispersing through the fibers 105F flows toward each of the first capacitive pad 103 and the second capacitive pad 104 and is transmitted into the first capacitive pad 103 and the second capacitive pad 104 by the dielectric barrier interface 110 as displacement current. Voltage or current readings are then captured by the controller 108 which is compared to the stored predetermined contact resistance.

In one aspect, the differential capacitive probe 100 further includes a display 109 coupled to the controller 108. The display 109 is configured to provide an indication as to whether the measured contact resistance $R_3$ is within a predetermined range of the predetermined contact resistance as determined by the controller 108. The indication may be aural, visual (e.g., a color indication of red or green (so that the differential capacitive probe 100 is a go/no-go gauge indicating whether the contact resistance $R_3$ is within the predetermined range, such as that set by the United States Federal Aviation Administration). In other aspects, the indication may display a voltage, current, or resistance value, etc.), or any other suitable indication. In one aspect, the display 109 may be an onboard display such that the display 109 is coupled directly to the frame 101 of the differential capacitive probe 100. For example, where the differential capacitive probe 100 is a handheld test instrument 190, the display 109 may be indicator lights 1901 (FIG. 3A) on the handheld test instrument 190. When the differential capacitive probe 100 is placed in contact with the fiber reinforced material 105 and the fastener 111 to measure/test the contact resistance $R_3$, the controller 108 actuates the alternating current source 107 and the display 109 indicates either the red light (i.e., out of tolerance contact resistance) or the green light (i.e., in tolerance contact resistance) directly on the handheld test instrument 190. In other aspect, the display 109 may be remote such as at an operator's station. In other aspects, a measurement reading/value (e.g., in ohms) may be provided on the display 109.

Referring now to FIGS. 1 and 3-10, a method 9000 for measuring a contact resistance $R_3$ with a differential capacitive probe 100 is illustrated. The method 9000 includes generating an electrical current flow 170 (e.g., alternating current) through the fiber reinforced material 105 (FIG. 10, Block 9001) between the end effector 102 of the differential capacitive probe 100 and each of the first capacitive pad 103 and the second capacitive pad 104 of the differential capacitive probe. The second capacitive pad 104 is radially spaced, relative to the end effector 102, from the first capacitive pad 103 so that the first capacitive pad 103 and the second capacitive pad 104 each at least partially circumscribe the end effector 102 and the contact surface area 103S of the first capacitive pad 103 is substantially the same as another contact surface area 104S of the second capacitive pad 104. In one aspect, generating the electrical current flow 170 through the fiber reinforced material 105 includes transferring the electrical current flow 170 from the alternating current source 107 through the end effector 102 and into the fiber reinforced material 105. In another aspect, generating the electrical current flow 170 through the fiber reinforced material 105 includes transferring the electrical current flow 170 from the alternating current source 107 through the end effector 102 and into the fastener 111 coupled to the fiber reinforced material 105. The method further includes receiving, with the controller 108 coupled to the first capacitive pad 103 and the second capacitive pad 104, respective voltage readings from the first capacitive pad 103 and the second capacitive pad 104 (FIG. 10, Block 9002). The controller 108 determines a contact resistance $R_3$ with the fiber reinforced material 105 (FIG. 10, Block 9003). The determination substantially eliminates a fiber resistance of the fiber reinforced material 105 from the determined contact resistance. In one aspect, the contact resistance $R_3$ corresponds to a contact between the end effector 102 and the fiber reinforced material 105. In another aspect, the contact resistance $R_3$ corresponds to a contact between the fastener 111 and the fiber reinforced material 105, where the fastener 111 is coupled to both the end effector 102 and the fiber reinforced material 105.

In one aspect, the differential capacitive probe 100 may be automatically moved relative to the fiber reinforced material 105 to determine the contact resistance $R_3$ at a plurality of locations on the fiber reinforced material 105 (i.e., multiple fastening locations to fasten the panel to the frame 905 of the aircraft 900).

In one aspect, the controller 108 determining the contact resistance $R_3$ between the end effector 102 and the fiber reinforced material 105 is made in situ with a dispensation of the conductive gap filler 112 from the end effector 102 into the fastener aperture 106 of the fiber reinforced material 105. In another aspect, determining the contact resistance $R_3$ between the fastener 111 and the fiber reinforced material 105 is made in situ with an insertion of the fastener 111 by the end effector 102 into the fastener aperture 106 of the fiber reinforced material 105.

In one aspect, the controller 108 compares the determined contact resistance $R_3$ with a predetermined contact resistance, stored in the controller 108 and causes an indication as to whether the determined contact resistance $R_3$ is within a predetermined range of the predetermined contact resistance to be displayed on the display 109.

In one aspect, current flows from the fiber reinforced material 105 to each of the first capacitive pad 103 and the second capacitive pad 104 by displacement through the dielectric barrier interface 110.

Examples of the present disclosure may be described in the context of aircraft manufacturing and service method 2000 as shown in FIG. 11. In other aspects, the examples of the present disclosure may be applied in any suitable industry, such as e.g., automotive, maritime, aerospace, etc. With respect to aircraft manufacturing, during pre-production, illustrative method 2000 may include specification and design (Block 2001) of aircraft 900 (FIG. 2) and material procurement (Block 2002). During production, component and subassembly manufacturing (Block 2003) and system integration (Block 2004) of aircraft 900 may take place. Thereafter, aircraft 900 may go through certification and delivery (Block 2005) to be placed in service (Block 2006). While in service, aircraft 900 may be scheduled for routine maintenance and service (Block 2007). Routine maintenance and service may include modification, reconfiguration, refurbishment, etc. of one or more systems of aircraft 900 which may include use of the differential capacitive probe 100 as described herein.

Each of the processes of illustrative method 2000 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

Apparatus(es) and method(s) shown or described herein may be employed during any one or more of the stages of the manufacturing and service method 2000. For example, components or subassemblies corresponding to component and subassembly manufacturing (Block 2003) may be fabricated or manufactured in a manner similar to components or subassemblies produced while aircraft 900 is in service (Block 2006). Also, one or more examples of the apparatus(es), method(s), or combination thereof may be utilized during production stages 2003 and 2004, for example, by substantially expediting assembly of or reducing the cost of aircraft 900. Similarly, one or more examples of the apparatus or method realizations, or a combination thereof, may be utilized, for example and without limitation, while aircraft 900 is in service (Block 2006) and/or during maintenance and service (Block 2007).

The following are provided in accordance with the aspects of the present disclosure:

A1. A differential capacitive probe for measuring contact resistance, the differential capacitive probe comprising:

a frame;

an end effector extending from the frame;

a first capacitive pad coupled to the frame so as to at least partially circumscribe the end effector; and a second capacitive pad coupled to the frame so as to be radially spaced, relative to the end effector, from the first capacitive pad and to at least partially circumscribe the end effector;

wherein a contact surface area of the first capacitive pad is substantially the same as another contact surface of the second capacitive pad.

A2. The differential capacitive probe of paragraph A1, where the first capacitive pad and the second capacitive pad are configured so as to conform to a surface of a fiber reinforced material.

A3. The differential capacitive probe of paragraph A2, wherein the end effector is configured for insertion into a fastener aperture that extends at least partially through the fiber reinforced material so as to dispense a conductive gap filler into the fastener aperture.

A4. The differential capacitive probe of paragraph A3, wherein the end effector is configured to dispense the conductive gap filler in the form of a low melting point alloy.

A5. The differential capacitive probe of paragraph A3, wherein:

the end effector comprises an alternating current source that generates an electrical current flow through the fiber reinforced material; and the first capacitive pad and the second capacitive pad are configured to receive the electrical current flow where the spacing between the first capacitive pad and the second capacitive pad effects an in situ contact resistance measurement that is substantially isolated to contact between the end effector and the fiber reinforced material.

A6. The differential capacitive probe of paragraph A2, wherein the end effector is configured to hold a fastener for insertion into a fastener aperture that extends at least partially through the fiber reinforced material so as to insert the fastener into the fastener aperture.

A7. The differential capacitive probe of paragraph A6, wherein:

the end effector comprises an alternating current source that generates an electrical current flow through the fiber reinforced material; and the first capacitive pad and the second capacitive pad are configured to receive the electrical current flow where the spacing between the first capacitive pad and the second capacitive pad effects an in situ contact resistance measurement that is substantially isolated to contact between the fastener and the fiber reinforced material.

A8. The differential capacitive probe of paragraph A2, wherein the end effector is configured for insertion into a fastener aperture that extends at least partially through the fiber reinforced material.

A9. The differential capacitive probe of paragraph A8, wherein:

the end effector comprises an alternating current source that generates an electrical current flow through the fiber reinforced material; and the first capacitive pad and the second capacitive pad are configured to receive the electrical current flow where the spacing between the first capacitive pad and the second capacitive pad effects a contact resistance measurement that is substantially isolated to contact between the end effector and the fiber reinforced material.

A10. The differential capacitive probe of paragraph A2, wherein the end effector is configured to couple with a fastener inserted into a fastener aperture that extends at least partially through the fiber reinforced material.

A11. The differential capacitive probe of paragraph A10, wherein:

the end effector comprises an alternating current source that generates an electrical current flow through the fiber reinforced material; and the first capacitive pad and the second capacitive pad are configured to receive the electrical current flow where the spacing between the first capacitive pad and the second capacitive pad effects a contact resistance measurement that is substantially isolated to contact between the fastener and the fiber reinforced material.

A12. The differential capacitive probe of paragraph A1, wherein the end effector, the first capacitive pad and the second capacitive pad form an electrical circuit configured to substantially eliminate a fiber resistance of the fiber reinforced material from a measured contact resistance between the fastener and the fiber reinforced material.

A13. The differential capacitive probe of paragraph A1, wherein the first capacitive pad comprises a continuous circular member.

A14. The differential capacitive probe of paragraph A1, wherein the second capacitive pad comprises a continuous circular member.

A15. The differential capacitive probe of paragraph A1, wherein the first capacitive member comprises a plurality of arcuate members.

A16. The differential capacitive probe of paragraph A1, wherein the second capacitive member comprises a plurality of arcuate members.

A17. The differential capacitive probe of paragraph A1, further comprising:

an alternating current source coupled to the end effector; and a controller configured to actuate the alternating current source and receive voltage readings from each of the first capacitive pad and the second capacitive pad.

A18. The differential capacitive probe of paragraph A17, wherein the controller is configured to determine the contact resistance between the end effector and a fiber reinforced material that couples the end effector to each of the first capacitive pad and the second capacitive pad.

A19. The differential capacitive probe of paragraph A17, wherein the controller is configured to determine the contact resistance between a fastener coupled with the end effector and a fiber reinforced material that couples the fastener to each of the first capacitive pad and the second capacitive pad.

A20. The differential capacitive probe of paragraph A17, further comprising:

a display coupled to the controller; and wherein the controller is configured to compare a measured contact resistance with a predetermined contact resistance and provide, through the display, an indication as to whether the measured contact resistance is within a predetermined range of the predetermined contact resistance.

A21. The differential capacitive probe of paragraph A1, wherein the first capacitive pad and the second capacitive pad each include a dielectric barrier interface configured to couple with a surface of a fiber reinforced material.

A22. The differential capacitive probe of paragraph A1, wherein the first capacitive probe and the second capacitive probe comprise a metallic material.

B1. A differential capacitive probe for measuring contact resistance, the differential capacitive probe comprising:

a frame;

an end effector extending from the frame;

an alternating current source coupled to the end effector;

a first capacitive pad coupled to the frame so as to at least partially circumscribe the end effector; and a second capacitive pad coupled to the frame so as to be radially spaced, relative to the end effector, from the first capacitive pad and to at least partially circumscribe the end effector;

wherein a contact surface area of the first capacitive pad is substantially the same as another contact surface of the second capacitive pad, wherein electrical current flows from the end effector to each of the first capacitive pad and the second capacitive pad through at least a fiber reinforced material coupling the end effector to each of the first capacitive pad and the second capacitive pad.

B2. The differential capacitive probe of paragraph B1, where the first capacitive pad and the second capacitive pad are configured so as to conform to a surface of the fiber reinforced material.

B3. The differential capacitive probe of paragraph B2, wherein the end effector is configured for insertion into a fastener aperture that extends at least partially through the fiber reinforced material so as to dispense a conductive gap filler into the fastener aperture.

B4. The differential capacitive probe of paragraph B3, wherein the end effector is configured to dispense the conductive gap filler in the form of a low melting point alloy.

B5. The differential capacitive probe of paragraph B3, wherein the spacing between the first capacitive pad and the second capacitive pad effects an in situ contact resistance measurement that is substantially isolated to contact between the end effector and the fiber reinforced material.

B6. The differential capacitive probe of paragraph B2, wherein the end effector is configured to hold a fastener for insertion into a fastener aperture that extends at least partially through the fiber reinforced material so as to insert the fastener into the fastener aperture.

B7. The differential capacitive probe of paragraph B6, wherein the spacing between the first capacitive pad and the second capacitive pad effects an in situ contact resistance measurement that is substantially isolated to contact between the fastener and the fiber reinforced material.

B8. The differential capacitive probe of paragraph B2, wherein the end effector is configured for insertion into a fastener aperture that extends at least partially through the fiber reinforced material.

B9. The differential capacitive probe of paragraph B8, wherein the spacing between the first capacitive pad and the second capacitive pad effects a contact resistance measurement that is substantially isolated to contact between the end effector and the fiber reinforced material.

B10. The differential capacitive probe of paragraph B2, wherein the end effector is configured to couple with a fastener inserted into a fastener aperture that extends at least partially through the fiber reinforced material.

B11. The differential capacitive probe of paragraph B10, wherein the spacing between the first capacitive pad and the second capacitive pad effects a contact resistance measurement that is substantially isolated to contact between the fastener and the fiber reinforced material.

B12. The differential capacitive probe of paragraph B1, wherein the end effector, the first capacitive pad and the second capacitive pad form an electrical circuit configured to substantially eliminate a fiber resistance of the fiber reinforced material from a measured contact resistance between the fastener and the fiber reinforced material.

B13. The differential capacitive probe of paragraph B1, wherein the first capacitive pad comprises a continuous circular member.

B14. The differential capacitive probe of paragraph B1, wherein the second capacitive pad comprises a continuous circular member.

B15. The differential capacitive probe of paragraph B1, wherein the first capacitive member comprises a plurality of arcuate members.

B16. The differential capacitive probe of paragraph B1, wherein the second capacitive member comprises a plurality of arcuate members.

B17. The differential capacitive probe of paragraph B1, further comprising a controller configured to actuate the alternating current source and receive voltage readings from each of the first capacitive pad and the second capacitive pad.

B18. The differential capacitive probe of paragraph B17, wherein the controller is configured to determine the contact resistance between the end effector and the fiber reinforced material that couples the end effector to each of the first capacitive pad and the second capacitive pad.

B19. The differential capacitive probe of paragraph B17, wherein the controller is configured to determine the contact resistance between a fastener coupled with the end effector and the fiber reinforced material that couples the fastener to each of the first capacitive pad and the second capacitive pad.

B20. The differential capacitive probe of paragraph B17, further comprising:
a display coupled to the controller; and
wherein the controller is configured to compare a measured contact resistance with a predetermined contact resistance and provide, through the display, an indication as to whether the measured contact resistance is within a predetermined range of the predetermined contact resistance.

B21. The differential capacitive probe of paragraph B1, wherein the first capacitive pad and the second capacitive pad each include a dielectric barrier interface configured to couple with a surface of a fiber reinforced material.

B22. The differential capacitive probe of paragraph B1, wherein the first capacitive probe and the second capacitive probe comprise a metallic material.

C1. A method for measuring a contact resistance with a fiber reinforced material, the method comprising:
generating an electrical current flow through the fiber reinforced material between an end effector of a differential capacitive probe and each of a first capacitive pad and a second capacitive pad of the differential capacitive probe, where the second capacitive pad is radially spaced, relative to the end effector, from the first capacitive pad so that the first capacitive pad and the second capacitive pad each at least partially circumscribe the end effector and a contact surface area of the first capacitive pad is substantially the same as another contact surface of the second capacitive pad;
receiving, with a controller coupled to the first capacitive pad and the second capacitive pad, respective voltage readings from the first capacitive pad and the second capacitive pad; and
determining, with the controller, a contact resistance with the fiber reinforced material where the determination substantially eliminates a fiber resistance of the fiber reinforced material from the determined contact resistance.

C2. The method of paragraph C1, wherein the contact resistance corresponds to a contact between the end effector and the fiber reinforced material.

C3. The method of paragraph C2, wherein determining the contact resistance between the end effector and the fiber reinforced material is made in situ with a dispensation of a conductive gap filler from the end effector into a fastener aperture of the fiber reinforced material.

C4. The method of paragraph C1, wherein the contact resistance corresponds to a contact between a fastener and the fiber reinforced material, where the fastener is coupled to both the end effector and the fiber reinforced material.

C5. The method of paragraph C4, wherein determining the contact resistance between the fastener and the fiber reinforced material is made in situ with an insertion of the fastener by the end effector into a fastener aperture of the fiber reinforced material.

C6. The method of paragraph C1, further comprising automatically moving the differential capacitive probe relative to the fiber reinforced material to determine the contact resistance at a plurality of locations on the fiber reinforced material.

C7. The method of paragraph C1, further comprising:
comparing, with the controller, the determined contact resistance with a predetermined contact resistance; and causing to be displayed, on a display coupled to the controller, with the controller an indication as to whether the determined contact resistance is within a predetermined range of the predetermined contact resistance.

C8. The method of paragraph C1, wherein current flows from the fiber reinforced material to each of the first capacitive pad and the second capacitive pad by displacement through a dielectric barrier.

In the figures, referred to above, solid lines, if any, connecting various elements and/or components may represent mechanical, electrical, fluid, optical, electromagnetic, wireless and other couplings and/or combinations thereof. As used herein, "coupled" means associated directly as well as indirectly. For example, a member A may be directly associated with a member B, or may be indirectly associated therewith, e.g., via another member C. It will be understood that not all relationships among the various disclosed elements are necessarily represented. Accordingly, couplings other than those depicted in the drawings may also exist. Dashed lines, if any, connecting blocks designating the various elements and/or components represent couplings similar in function and purpose to those represented by solid lines; however, couplings represented by the dashed lines may either be selectively provided or may relate to alternative examples of the present disclosure. Likewise, elements and/or components, if any, represented with dashed lines, indicate alternative examples of the present disclosure. One or more elements shown in solid and/or dashed lines may be omitted from a particular example without departing from the scope of the present disclosure. Environmental elements, if any, are represented with dotted lines. Virtual (imaginary) elements may also be shown for clarity. Those skilled in the art will appreciate that some of the features illustrated in the figures, may be combined in various ways without the need to include other features described in the figures, other drawing figures, and/or the accompanying disclosure, even though such combination or combinations are not explicitly illustrated herein. Similarly, additional features not limited to the examples presented, may be combined with some or all of the features shown and described herein.

In FIGS. 10 and 11, referred to above, the blocks may represent operations and/or portions thereof and lines connecting the various blocks do not imply any particular order or dependency of the operations or portions thereof. Blocks represented by dashed lines indicate alternative operations and/or portions thereof. Dashed lines, if any, connecting the various blocks represent alternative dependencies of the operations or portions thereof. It will be understood that not all dependencies among the various disclosed operations are necessarily represented. FIGS. 10 and 11 and the accompanying disclosure describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or substantially simultaneously. Additionally, those skilled in the art will appreciate that not all operations described need be performed.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A differential capacitive probe for measuring contact resistance, the differential capacitive probe comprising:
a frame;
an end effector extending from the frame;
a first capacitive pad coupled to the frame so as to at least partially circumscribe the end effector; and
a second capacitive pad coupled to the frame so as to be radially spaced, relative to the end effector, from the first capacitive pad and to at least partially circumscribe the end effector;
wherein a contact surface area of the first capacitive pad is substantially the same as another contact surface area of the second capacitive pad.

2. The differential capacitive probe of claim 1, where the first capacitive pad and the second capacitive pad are configured so as to conform to a surface of a fiber reinforced material.

3. The differential capacitive probe of claim 2, wherein the end effector is configured for insertion into a fastener aperture that extends at least partially through the fiber reinforced material so as to dispense a conductive gap filler into the fastener aperture.

4. The differential capacitive probe of claim 3, wherein the end effector is configured to dispense the conductive gap filler in the form of a low melting point alloy.

5. The differential capacitive probe of claim 3, wherein:
the end effector comprises an alternating current source that generates an electrical current flow through the fiber reinforced material; and
the first capacitive pad and the second capacitive pad are configured to receive the electrical current flow where the spacing between the first capacitive pad and the second capacitive pad effects an in situ contact resistance measurement that is substantially isolated to contact between the end effector and the fiber reinforced material.

6. The differential capacitive probe of claim 1, wherein the end effector, the first capacitive pad and the second capacitive pad form an electrical circuit configured to substantially eliminate a fiber resistance of the fiber reinforced material from a measured contact resistance between a fastener and the fiber reinforced material.

7. The differential capacitive probe of claim 1, further comprising:
an alternating current source coupled to the end effector; and
a controller configured to actuate the alternating current source and receive voltage readings from each of the first capacitive pad and the second capacitive pad.

8. The differential capacitive probe of claim 7, wherein the controller is configured to determine the contact resistance between one of the end effector or a fastener coupled with the end effector and a fiber reinforced material that couples the end effector to each of the first capacitive pad and the second capacitive pad.

9. The differential capacitive probe of claim 7, further comprising:
a display coupled to the controller; and
wherein the controller is configured to compare a measured contact resistance with a predetermined contact resistance and provide, through the display, an indication as to whether the measured contact resistance is within a predetermined range of the predetermined contact resistance.

10. A differential capacitive probe for measuring contact resistance, the differential capacitive probe comprising:
a frame;
an end effector extending from the frame;
an alternating current source coupled to the end effector;
a first capacitive pad coupled to the frame so as to at least partially circumscribe the end effector; and
a second capacitive pad coupled to the frame so as to be radially spaced, relative to the end effector, from the first capacitive pad and to at least partially circumscribe the end effector;
wherein a contact surface area of the first capacitive pad is substantially the same as another contact surface area of the second capacitive pad, wherein electrical current flows from the end effector to each of the first capacitive pad and the second capacitive pad through at least a fiber reinforced material coupling the end effector to each of the first capacitive pad and the second capacitive pad.

11. The differential capacitive probe of claim 10, wherein the end effector is configured to hold a fastener for insertion into a fastener aperture that extends at least partially through the fiber reinforced material so as to insert the fastener into the fastener aperture.

12. The differential capacitive probe of claim 11, wherein a spacing between the first capacitive pad and the second capacitive pad effects an in situ contact resistance measurement that is substantially isolated to contact between the fastener and the fiber reinforced material.

13. The differential capacitive probe of claim 10, wherein the end effector is configured for insertion into a fastener aperture that extends at least partially through the fiber reinforced material.

14. The differential capacitive probe of claim 13, wherein a spacing between the first capacitive pad and the second capacitive pad effects a contact resistance measurement that is substantially isolated to contact between the end effector and the fiber reinforced material.

15. The differential capacitive probe of claim 10, wherein the end effector is configured to couple with a fastener inserted into a fastener aperture that extends at least partially through the fiber reinforced material.

16. The differential capacitive probe of claim 15, wherein a spacing between the first capacitive pad and the second capacitive pad effects a contact resistance measurement that is substantially isolated to contact between the fastener and the fiber reinforced material.

17. The differential capacitive probe of claim 10, wherein the first capacitive pad and the second capacitive pad each include a dielectric barrier interface configured to couple with a surface of a fiber reinforced material.

18. A method for measuring a contact resistance with a fiber reinforced material, the method comprising:
generating an electrical current flow through the fiber reinforced material between an end effector of a differential capacitive probe and each of a first capacitive pad and a second capacitive pad of the differential capacitive probe, where the second capacitive pad is radially spaced, relative to the end effector, from the first capacitive pad so that the first capacitive pad and the second capacitive pad each at least partially circumscribe the end effector and a contact surface area of the first capacitive pad is substantially the same as another contact surface area of the second capacitive pad;
receiving, with a controller coupled to the first capacitive pad and the second capacitive pad, respective voltage readings from the first capacitive pad and the second capacitive pad; and determining, with the controller, a contact resistance with the fiber reinforced material where the determination substantially eliminates a fiber resistance of the fiber reinforced material from the determined contact resistance.

19. The method of claim 18, further comprising automatically moving the differential capacitive probe relative to the fiber reinforced material to determine the contact resistance at a plurality of locations on the fiber reinforced material.

20. The method of claim 18, further comprising:
comparing, with the controller, the determined contact resistance with a predetermined contact resistance; and
causing to be displayed, on a display coupled to the controller, with the controller an indication as to whether the determined contact resistance is within a predetermined range of the predetermined contact resistance.

* * * * *